US010938396B2

(12) United States Patent
Agrawal et al.

(10) Patent No.: US 10,938,396 B2
(45) Date of Patent: Mar. 2, 2021

(54) QUADRATURE LOCAL OSCILLATOR SIGNAL GENERATION SYSTEMS AND METHODS

(71) Applicant: Apple Inc., Cupertino, CA (US)

(72) Inventors: Abhishek Agrawal, Beaverton, OR (US); Alon Cohen, Petach Tikva (IL); Gil Horovitz, Emek-Hefer (IL); Somnath Kundu, Hillsboro, OR (US); Run Levinger, Tel Aviv (IL); Stefano Pellerano, Beaverton, OR (US); Jahnavi Sharma, Hillsboro, OR (US); Evgeny Shumaker, Nesher (IL); Izhak Hod, Haifa (IL)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/352,043

(22) Filed: Mar. 13, 2019

(65) Prior Publication Data
US 2020/0295765 A1 Sep. 17, 2020

(51) Int. Cl.
*H03L 7/081* (2006.01)
*H03L 7/083* (2006.01)

(52) U.S. Cl.
CPC .............. *H03L 7/081* (2013.01); *H03L 7/083* (2013.01)

(58) Field of Classification Search
CPC ....................................................... H03L 7/081
USPC .......................................................... 331/25
See application file for complete search history.

(56) References Cited

U.S. PATENT DOCUMENTS

| 8,436,689 | B2 * | 5/2013 | Lee ......................... H03B 27/00 331/117 FE |
| 2013/0271186 | A1 * | 10/2013 | Hossain .................. H03L 7/081 327/107 |

OTHER PUBLICATIONS

Andreani, Pietro et al. "On the Phase-Noise and Phase-Error Performances of Multiphase LC CMOS VCOs." IEEE Journal of Solid-State Circuits, vol. 39, No. 11, Nov. 2004. 11 pages.
(Continued)

*Primary Examiner* — Joseph Chang
(74) *Attorney, Agent, or Firm* — Eschweiler & Potashnik, LLC

(57) ABSTRACT

A quadrature based voltage controlled oscillator (VCO) local oscillator (LO) system is disclosed. The system includes a phase detector, a quadrature phase VCO, a quadrature control path, an in-phase control path, and an in-phase VCO. The phase detector is configured to compare and generate phase error between a reference clock and an in-phase VCO output. The quadrature control path configured to generate a quadrature control voltage based on a quadrature VCO output and the in-phase VCO output. The quadrature phase VCO configured to generate the quadrature VCO output based on the quadrature control voltage and the generated phase error. The in-phase control path configured to generate an in-phase control voltage based on the quadrature VCO output and the in-phase VCO output. The in-phase VCO is configured to generate the in-phase VCO output based on the in-phase control voltage and the generated phase error. An all digital dual mode phase locked/phase tracking loop LO generate system is also disclosed.

14 Claims, 20 Drawing Sheets

(56) References Cited

OTHER PUBLICATIONS

Djurhuus, Torsten et al. "Trade-Off Between Phase-Noise and Signal Quadrature in Unilaterally Coupled Oscillators." 2005 IEEE. 4 pages.

Yi, Xiang et al. "A 57.9-to-68.3 GHz 24.6 mW Frequency Synthesizer With In-Phase Injection-Coupled QVCO in 65 nm CMOS Technology." IEEE Journal of Solid-State Circuits, vol. 49, No. 2, Feb. 2014. 13 pages.

\* cited by examiner

QUADRATURE LOCAL OSCILLATOR SIGNAL GENERATION SYSTEMS AND METHODS

FIELD

Various embodiments generally relate to the field of signal generation.

BACKGROUND

Local oscillators generate local oscillator (LO) signals. LO signals are used in electronic devices, communication systems and the like.

LO signals can be used for a variety of operations, such as up conversion, down conversion, phase interpolation, frequency multiplication and the like.

The performance of these operations can vary depending on the characteristics of the LO signal. These characteristics can include tuning range, phase accuracy, tuning range and the like.

What are needed are techniques to facilitate LO generation and LO signals.

DETAILED DESCRIPTION

Figure 1:
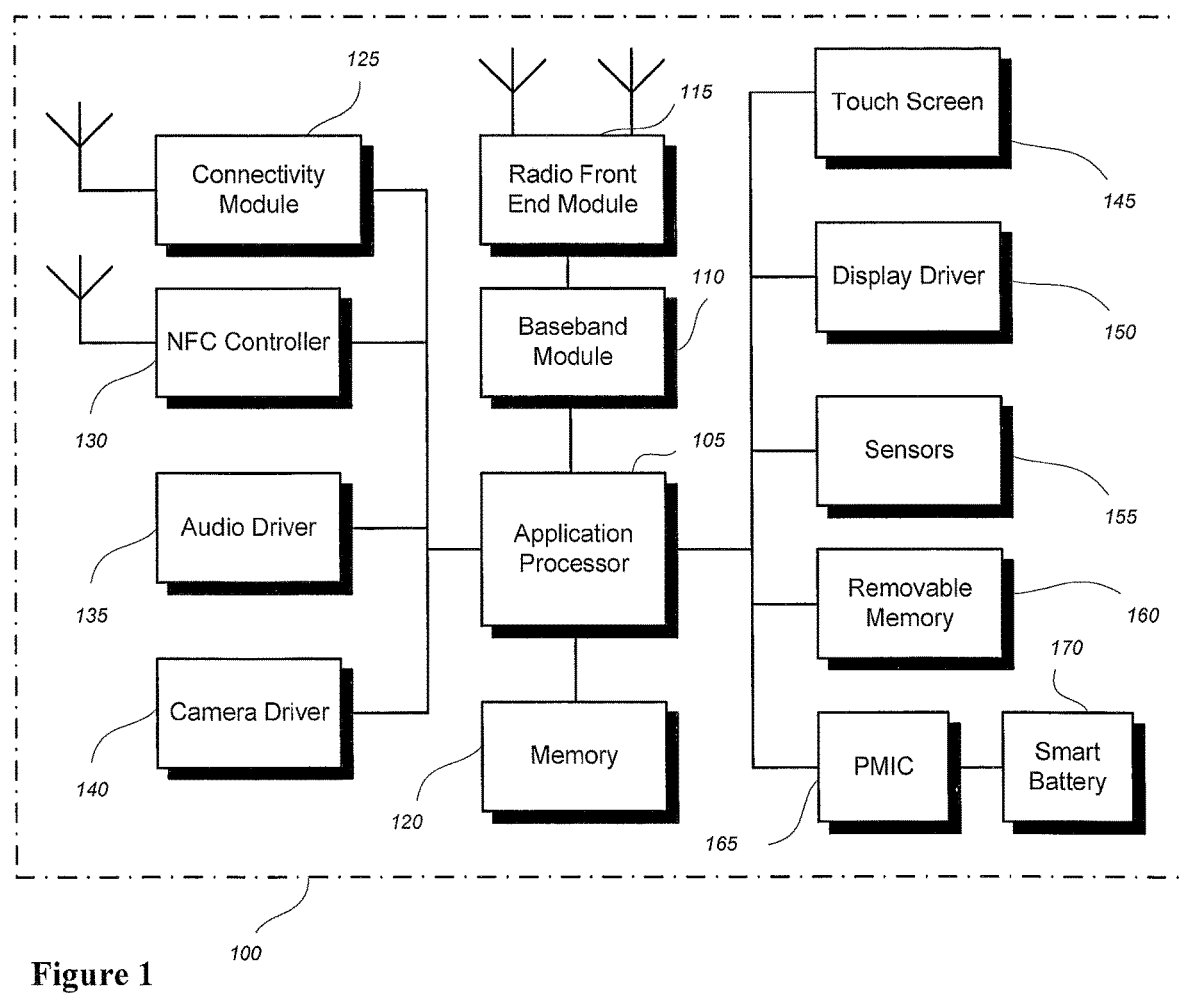
FIG. 1 illustrates an exemplary user device in accordance with an aspect.

The present disclosure will now be described with reference to the attached drawing figures, wherein like reference numerals are used to refer to like elements throughout, and wherein the illustrated structures and devices are not necessarily drawn to scale. The same reference numbers may be used in different drawings to identify the same or similar elements. In the following description, for purposes of explanation and not limitation, specific details are set forth such as particular structures, architectures, interfaces, techniques, etc. in order to provide a thorough understanding of the various aspects of various embodiments. However, it will be apparent to those skilled in the art having the benefit of the present disclosure that the various aspects of the various embodiments may be practiced in other examples that depart from these specific details. In certain instances, descriptions of well-known devices, circuits, and methods are omitted so as not to obscure the description of the various embodiments with unnecessary detail. Embodiments herein may be related to RAN1 and 5G.

As utilized herein, terms "component," "system," "interface," and the like are intended to refer to a computer-related entity, hardware, software (e.g., in execution), and/or firmware. For example, a component can be a processor, a process running on a processor, a controller, an object, an executable, a program, a storage device, and/or a computer with a processing device. By way of illustration, an application running on a server and the server can also be a component. One or more components can reside within a process, and a component can be localized on one computer and/or distributed between two or more computers. A set of elements or a set of other components can be described herein, in which the term "set" can be interpreted as "one or more."

Further, these components can execute from various computer readable storage media having various data structures stored thereon such as with a module, for example. The components can communicate via local and/or remote processes such as in accordance with a signal having one or more data packets (e.g., data from one component interacting with another component in a local system, distributed system, and/or across a network, such as, the Internet, a local area network, a wide area network, or similar network with other systems via the signal).

As another example, a component can be an apparatus with specific functionality provided by mechanical parts operated by electric or electronic circuitry, in which the electric or electronic circuitry can be operated by a software application or a firmware application executed by one or more processors. The one or more processors can be internal or external to the apparatus and can execute at least a part of the software or firmware application. As yet another example, a component can be an apparatus that provides specific functionality through electronic components without mechanical parts; the electronic components can include one or more processors therein to execute software and/or firmware that confer(s), at least in part, the functionality of the electronic components.

Use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form. Furthermore, to the extent that the terms "including", "includes", "having", "has", "with", or variants thereof are used in either the detailed description and the claims, such terms are intended to be inclusive in a manner similar to the term "comprising".

Quadrature local oscillators (LOs) are used in mm-Wave transceivers (>30 GHz) and the like for signal up/down conversion. Additionally, quadrature LOs are also used in phase shifters to perform phase interpolation and frequency multiplication.

The quadrature LO should have low phase noise and good/high phase accuracy, which impacts the quality of transmission of a desired signal in terms of both EVM and image rejection ratio.

For some quadrature LO generation approaches, coupled voltage-controlled oscillators (VCOs) with passive bidirectional coupling network using diode ring are used to reduce power consumption compared with other approaches, such as a poly-phase approach. For the coupled VCOs approach, phase accuracy can be improved by increasing the coupling network size, however this degrades the tank quality factor and increases the fixed capacitor value. Thus, the phase accuracy can be achieved, but with reduced phase noise performance, increased power consumption and a lower frequency tuning range.

The quadrature VCO output can have random phase progression between its outputs (lead or lag by 90 degrees, depending on the startup condition. As a result, an additional start up circuit is required to enforce a well-defined phase relationship between its outputs.

The startup circuit facilitates the correct phase progression at the LO's output and can be turned off in steady state to reduce power consumption. However, the startup circuit results in a reduced frequency tuning range due to increased capacitor loading on its tank.

Embodiments and/or aspects are disclosed that include a quadrature VCO LO generator coupled by tuning a VCO control voltage using a quadrature phase detector and a type 2 loop filter to facilitate quadrature phase progression during start-up and improved phase accuracy. The LO generator can mitigate a lossy coupling network and the loading associated with it. Further, the LO generator can achieve improved phase noise performance and higher frequency tuning range at mm-wave frequency with low power consumption than compared with other quadrature LO approaches.

It is appreciated that an oscillator, in one example, is an analog block used to generate frequency signals for a variety of purposes and applications, such as (but not limited to) communications, radar and the like. Control over the frequency of the oscillator (referred to as local oscillator (LO)), is important for frequency synthesis, in which long-term frequency stability of the LO output can be ensured by phase-locking a high-frequency local oscillator to a highly-stable low-frequency source (such as a quartz crystal oscillator).

Closed control contours have been the systems-of-choice for frequency synthesis, with the analog phase-locked loops (PLLs) slowly giving way to all-digital implementations. Regardless of the analog or all digital implementation, the a feedback is provided to the local oscillator, which eventually results in the shift of its oscillation frequency. In other words, the frequency of the oscillator is tunable by the above feedback signal.

In order to have the frequency tunable design, a VCO (Voltage Controlled Oscillator) or DCO (Digitally Controlled Oscillator), both of which a variable frequency output is created in a predetermined relation to a control word, either analog (usually a voltage signal) or digital (usually a multi-bit word). The local oscillator frequency is tunable, but can have serious tradeoffs in power consumption and signal purity/phase noise. For example, in VCOs, a varactor (variable capacitor) is typically used to obtain a continuous frequency range, resulting in nonlinearities and Q degradation (at least with integrated circuits technologies available today) that become very hard to cope with, particularly in millimeter-wave (mmW) frequencies.

Whereas in DCO's, in order to have sufficient resolution to act as a reasonable replacement of a VCO, the parasitic capacitance and circuit complexity increases to an extent that it is hardly feasible at mmW frequencies. The latter is also true when employing frequency oversampling modulation techniques to noise-shape the instantaneous frequency error.

In one approach, frequency synthesis is performed using a pipeline having several stages, such that only coarse tunability is implemented directly in the LO. The overall phase-locking can then be mediated by some external measure, usually piggybacking on an existent hardware. For example, in a transmission or a radar system, this could be done by numerical multiplication (in the digital domain) of the envelope signal with an output of a numerically controlled oscillator (NCO) accounting for the phase discrepancy and finally producing a perfectly phase-locked signal.

Aspects and/or embodiments are disclosed can facilitate close tracking of the phase of a local oscillator (free-running or coarsely locked) to produce a frequency error signal relative to a reference clock, which can be subsequently used to phase lock the local oscillator. Embodiments and/or aspects are also disclosed that include a dual mode LO generator or system. The LO generator or loop can be all digital and generates a LO signal. The LO generator includes a phase tracking (PT) mode where a generator a phase error can be used to update a frequency control word and to generate a phase compensation. The generated phase compensation can be used by transmitter, receiver and the like.

FIG. 1 illustrates a user device 100 in accordance with an aspect. The user device 100 may be a mobile device or a wearable device in some aspects and includes an application processor 105, baseband processor 110 (also referred to as a baseband module), radio front end module (RFEM) 115, memory 120, connectivity module 125, near field communication (NFC) controller 130, audio driver 135, camera driver 140, touch screen 145, display driver 150, sensors 155, removable memory 160, power management integrated circuit (PMIC) 165 and smart battery 170. The user device 100 can include and/or be incorporated with human proximity sensing circuitry.

In some aspects, application processor 105 may include, for example, one or more CPU cores and one or more of cache memory, low drop-out voltage regulators (LDOs), interrupt controllers, serial interfaces such as serial peripheral interface (SPI), inter-integrated circuit (I²C) or universal programmable serial interface module, real time clock (RTC), timer-counters including interval and watchdog timers, general purpose input-output (IO), memory card controllers such as secure digital/multi-media card (SD/MMC) or similar, universal serial bus (USB) interfaces, mobile industry processor interface (MIPI) interfaces and Joint Test Access Group (JTAG) test access ports.

In some aspects, baseband module 110 may be implemented, for example, as a solder-down substrate including one or more integrated circuits, a single packaged integrated circuit soldered to a main circuit board, and/or a multi-chip module containing two or more integrated circuits.

Figure 2:
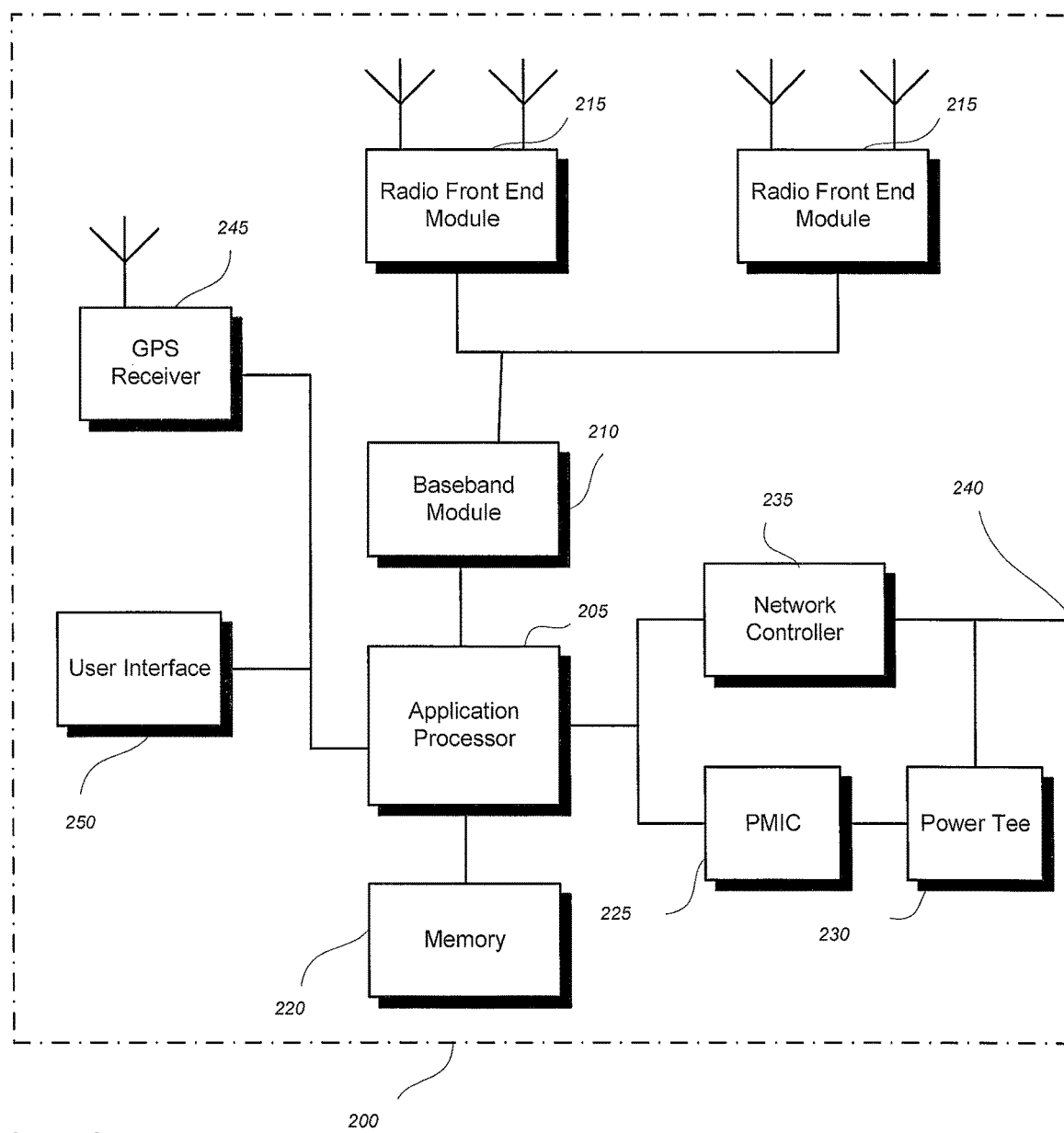
FIG. 2 illustrates an exemplary base station or infrastructure equipment radio head in accordance with an aspect.

FIG. 2 illustrates a base station or infrastructure equipment radio head 200 in accordance with an aspect. The base station radio head 200 may include one or more of application processor 205, baseband modules 210, one or more radio front end modules 215, memory 220, power management circuitry 225, power tee circuitry 230, network controller 235, network interface connector 240, satellite navigation receiver module 245, and user interface 250.

In some aspects, application processor 205 may include one or more CPU cores and one or more of cache memory, low drop-out voltage regulators (LDOs), interrupt controllers, serial interfaces such as SPI, I²C or universal programmable serial interface module, real time clock (RTC), timer-counters including interval and watchdog timers, general purpose IO, memory card controllers such as SD/MMC or similar, USB interfaces, MIPI interfaces and Joint Test Access Group (JTAG) test access ports.

In some aspects, baseband processor 210 may be implemented, for example, as a solder-down substrate including one or more integrated circuits, a single packaged integrated circuit soldered to a main circuit board or a multi-chip module containing two or more integrated circuits.

In some aspects, memory 220 may include one or more of volatile memory including dynamic random access memory (DRAM) and/or synchronous dynamic random access memory (SDRAM), and nonvolatile memory (NVM) including high-speed electrically erasable memory (commonly referred to as Flash memory), phase change random access memory (PRAM), magnetoresistive random access memory (MRAM) and/or a three-dimensional crosspoint memory. Memory 220 may be implemented as one or more of solder down packaged integrated circuits, socketed memory modules and plug-in memory cards.

In some aspects, power management integrated circuitry 225 may include one or more of voltage regulators, surge protectors, power alarm detection circuitry and one or more backup power sources such as a battery or capacitor. Power alarm detection circuitry may detect one or more of brown out (under-voltage) and surge (over-voltage) conditions.

In some aspects, power tee circuitry 230 may provide for electrical power drawn from a network cable to provide both power supply and data connectivity to the base station radio head 200 using a single cable.

In some aspects, network controller 235 may provide connectivity to a network using a standard network interface protocol such as Ethernet. Network connectivity may be provided using a physical connection which is one of electrical (commonly referred to as copper interconnect), optical or wireless.

In some aspects, satellite navigation receiver module 245 may include circuitry to receive and decode signals transmitted by one or more navigation satellite constellations such as the global positioning system (GPS), Globalnaya Navigatsionnaya Sputnikovaya Sistema (GLONASS), Galileo and/or BeiDou. The receiver 245 may provide data to application processor 205 which may include one or more of position data or time data. Application processor 205 may use time data to synchronize operations with other radio base stations.

In some aspects, user interface 250 may include one or more of physical or virtual buttons, such as a reset button, one or more indicators such as light emitting diodes (LEDs) and a display screen.

It is appreciated that the radio head 200 can also include a single RF front end module, including a single RF front end module for MIMO.

Figures 3A, 3B:
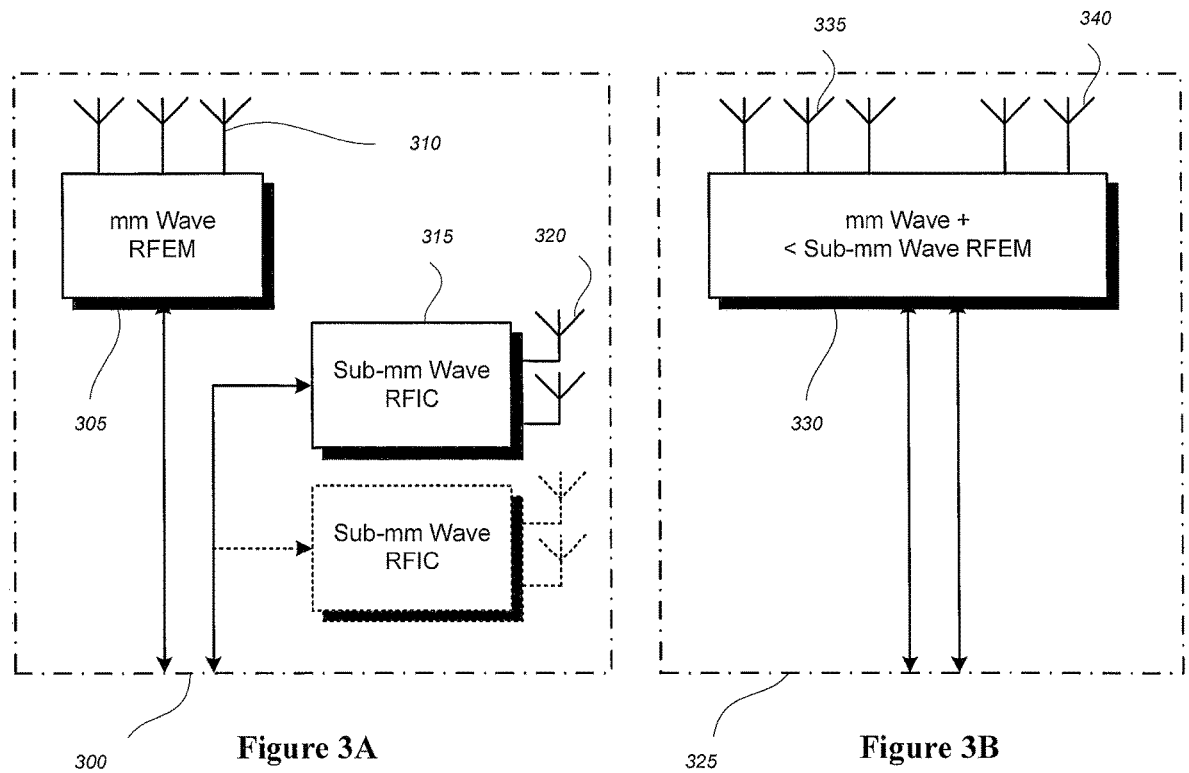
FIG. 3A and FIG. 3B illustrate aspects of an exemplary radio front end module.

FIG. 3A and FIG. 3B illustrate aspects of a radio front end module.

FIG. 3A illustrates an aspect of a radio front end module 300 incorporating a millimeter wave radio front end module (RFEM) 305 and one or more sub-millimeter wave radio frequency integrated circuits (RFIC) 315. In this aspect, the one or more sub-millimeter wave RFICs 315 may be physically separated from a millimeter wave RFEM 305. RFICs 315 may include connection to one or more antennas 320. RFEM 305 may be connected to multiple antennas 310.

FIG. 3B illustrates an alternate aspect of a radio front end module 325. In this aspect, both millimeter wave and sub-millimeter wave radio functions may be implemented in the same physical radio front end module 330. RFEM 330 may incorporate both millimeter wave antennas 335 and sub-millimeter wave antennas 340.

Figure 4A:
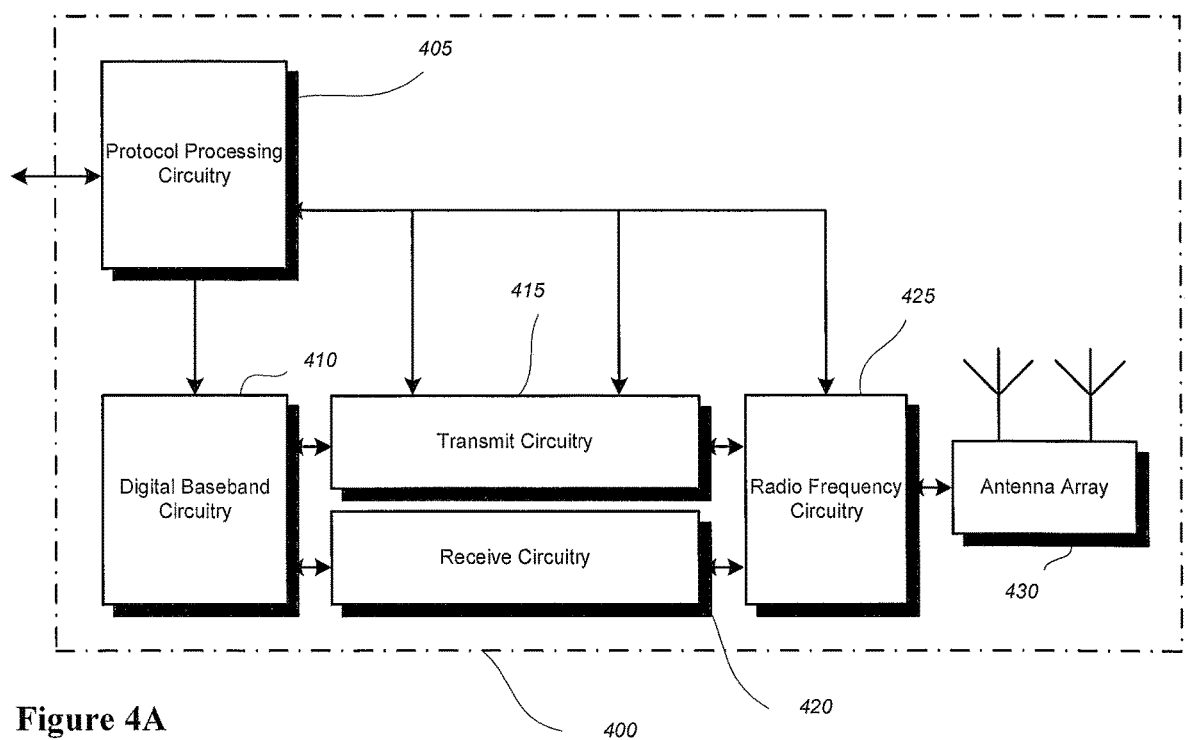
FIG. 4A illustrates an exemplary millimeter wave communication circuitry according to some aspects.

FIG. 4A illustrates an exemplary millimeter wave communication circuitry 400 according to some aspects. Circuitry 400 is alternatively grouped according to functions. Components as shown in 400 are shown here for illustrative purposes and may include other components not shown here in FIG. 4A.

Millimeter wave communication circuitry 400 may include protocol processing circuitry 405, which may implement one or more of medium access control (MAC), radio link control (RLC), packet data convergence protocol (PDCP), radio resource control (RRC) and non-access stratum (NAS) functions. Protocol processing circuitry 405 may include one or more processing cores (not shown) to execute instructions and one or more memory structures (not shown) to store program and data information.

Millimeter wave communication circuitry 400 may further include digital baseband circuitry 410, which may implement physical layer (PHY) functions including one or more of hybrid automatic repeat request (HARQ) functions, scrambling and/or descrambling, coding and/or decoding, layer mapping and/or de-mapping, modulation symbol mapping, received symbol and/or bit metric determination, multi-antenna port pre-coding and/or decoding which may include one or more of space-time, space-frequency or spatial coding, reference signal generation and/or detection, preamble sequence generation and/or decoding, synchronization sequence generation and/or detection, control channel signal blind decoding, and other related functions.

Millimeter wave communication circuitry 400 may further include transmit circuitry 415, receive circuitry 420 and/or antenna array circuitry 430.

Millimeter wave communication circuitry 400 may further include radio frequency (RF) circuitry 425. In an aspect of the invention, RF circuitry 425 may include multiple parallel RF chains for one or more of transmit or receive functions, each connected to one or more antennas of the antenna array 430.

In an aspect of the disclosure, protocol processing circuitry 405 may include one or more instances of control circuitry (not shown) to provide control functions for one or more of digital baseband circuitry 410, transmit circuitry 415, receive circuitry 420, and/or radio frequency circuitry 425.

Figure 4B:
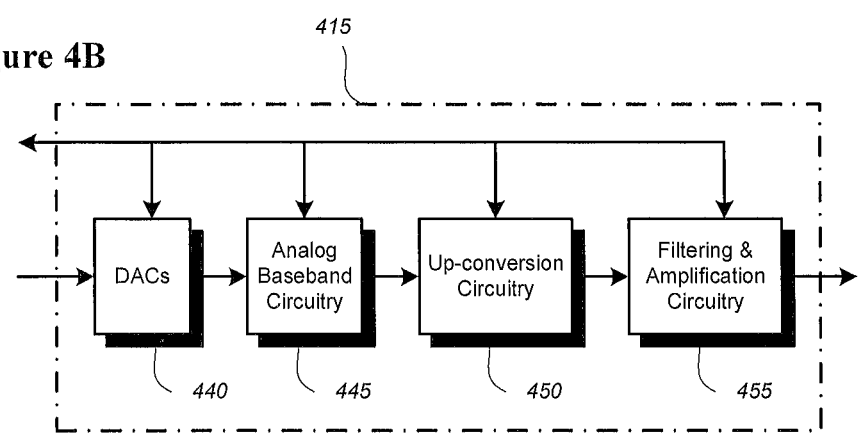
FIGS. 4B and 4C illustrate examples for transmit circuitry in FIG. 4A in some aspects.
Figure 4C:
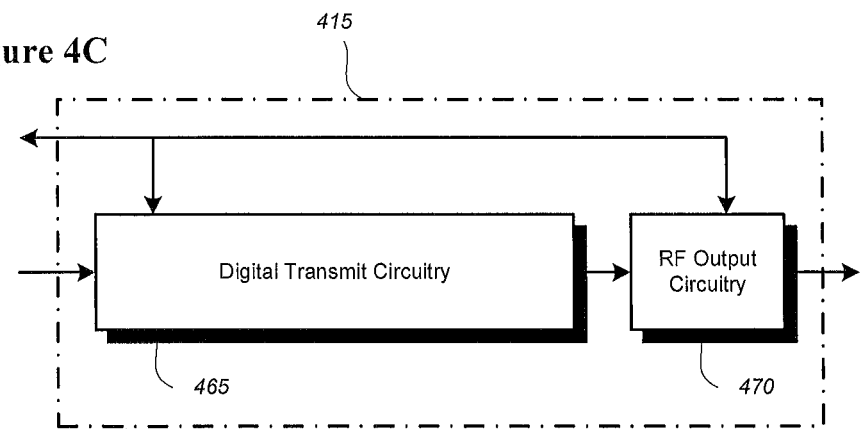

FIGS. 4B and 4C illustrate examples for transmit circuitry 415 in FIG. 4A in some aspects.

The exemplary transmit circuitry 415 of FIG. 4B may include one or more of digital to analog converters (DACs) 440, analog baseband circuitry 445, up-conversion circuitry 450 and filtering and amplification circuitry 455. In another aspect, 4C illustrates an exemplary transmit circuitry 415 which includes digital transmit circuitry 465 and output circuitry 470.

Figure 4D:
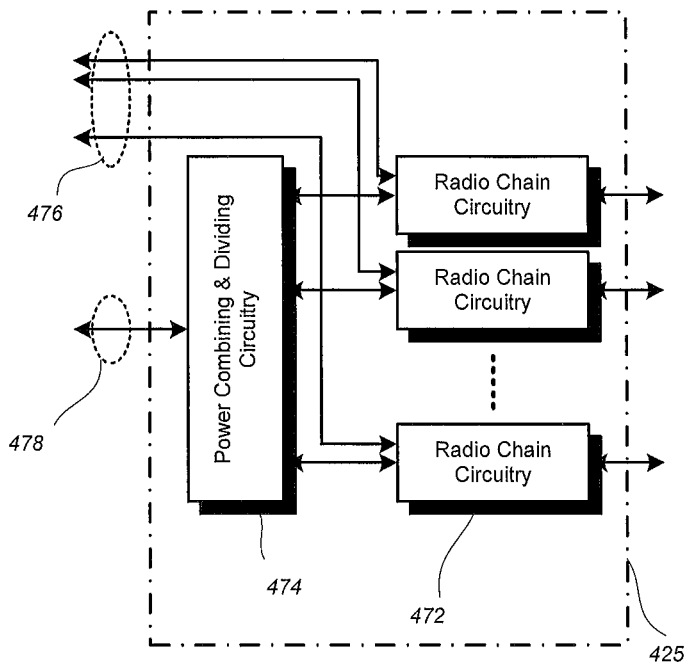
FIG. 4D illustrates an exemplary radio frequency circuitry in FIG. 4A according to some aspects.

FIG. 4D illustrates an exemplary radio frequency circuitry 425 in FIG. 4A according to some aspects.

Radio frequency circuitry 425 may include one or more instances of radio chain circuitry 472, which in some aspects may include one or more filters, power amplifiers, low noise amplifiers, programmable phase shifters and power supplies (not shown).

Radio frequency circuitry 425 may include power combining and dividing circuitry 474 in some aspects. In some aspects, power combining and dividing circuitry 474 may operate bidirectionally, such that the same physical circuitry may be configured to operate as a power divider when the device is transmitting, and as a power combiner when the device is receiving. In some aspects, power combining and dividing circuitry 474 may one or more include wholly or partially separate circuitries to perform power dividing when the device is transmitting and power combining when the device is receiving. In some aspects, power combining and dividing circuitry 474 may include passive circuitry comprising one or more two-way power divider/combiners arranged in a tree. In some aspects, power combining and dividing circuitry 474 may include active circuitry comprising amplifier circuits.

In some aspects, radio frequency circuitry 425 may connect to transmit circuitry 415 and receive circuitry 420 in FIG. 4A via one or more radio chain interfaces 476 or a combined radio chain interface 478.

In some aspects, one or more radio chain interfaces 476 may provide one or more interfaces to one or more receive or transmit signals, each associated with a single antenna structure which may comprise one or more antennas.

In some aspects, the combined radio chain interface 478 may provide a single interface to one or more receive or transmit signals, each associated with a group of antenna structures comprising one or more antennas.

Figure 4E:
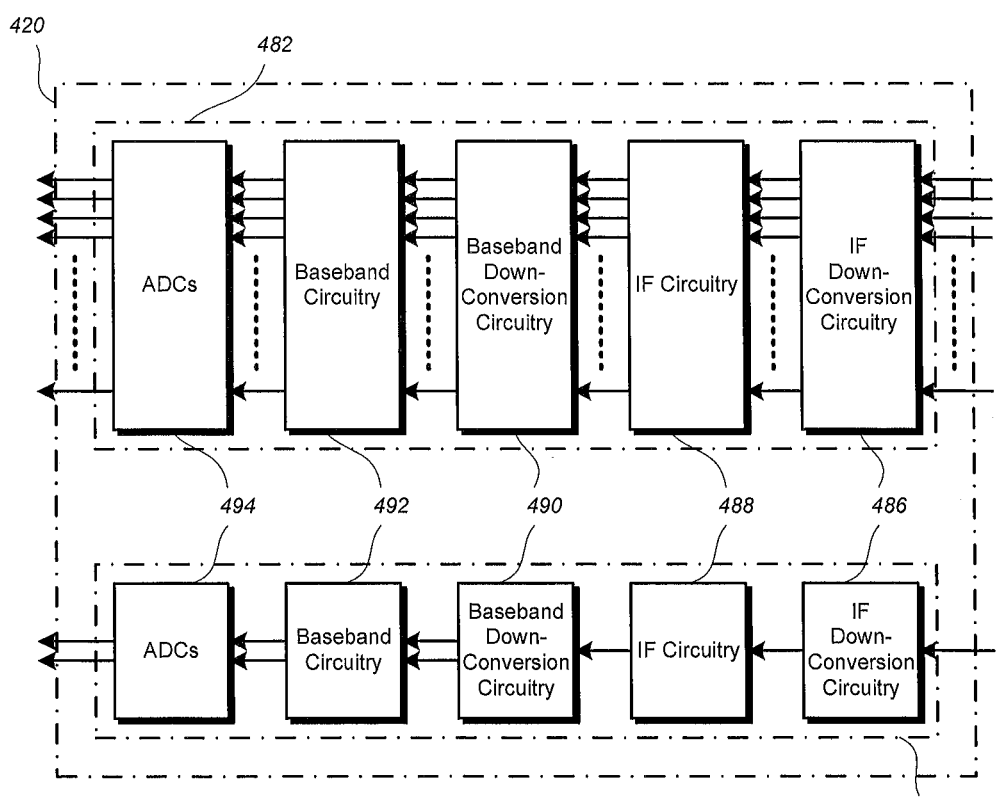
FIG. 4E illustrates exemplary receive circuitry in FIG. 4A according to some aspects.

FIG. 4E illustrates exemplary receive circuitry 420 in FIG. 4A according to some aspects. Receive circuitry 420 may include one or more of parallel receive circuitry 482 and/or one or more of combined receive circuitry 484.

In some aspects, the one or more parallel receive circuitry 482 and one or more combined receive circuitry 484 may include one or more Intermediate Frequency (IF) down-conversion circuitry 486, IF processing circuitry 488, baseband down-conversion circuitry 490, baseband processing circuitry 492 and analog-to-digital converter (ADC) circuitry 494.

It is appreciated that various components of the front devices 100 and 200, including front end modules 115 and 215, can utilize one or more transformers for impedance matching, signal generation and the like. These transformers can be at least partially implemented using varactors (voltage controlled capacitors) and the like.

Figure 5:
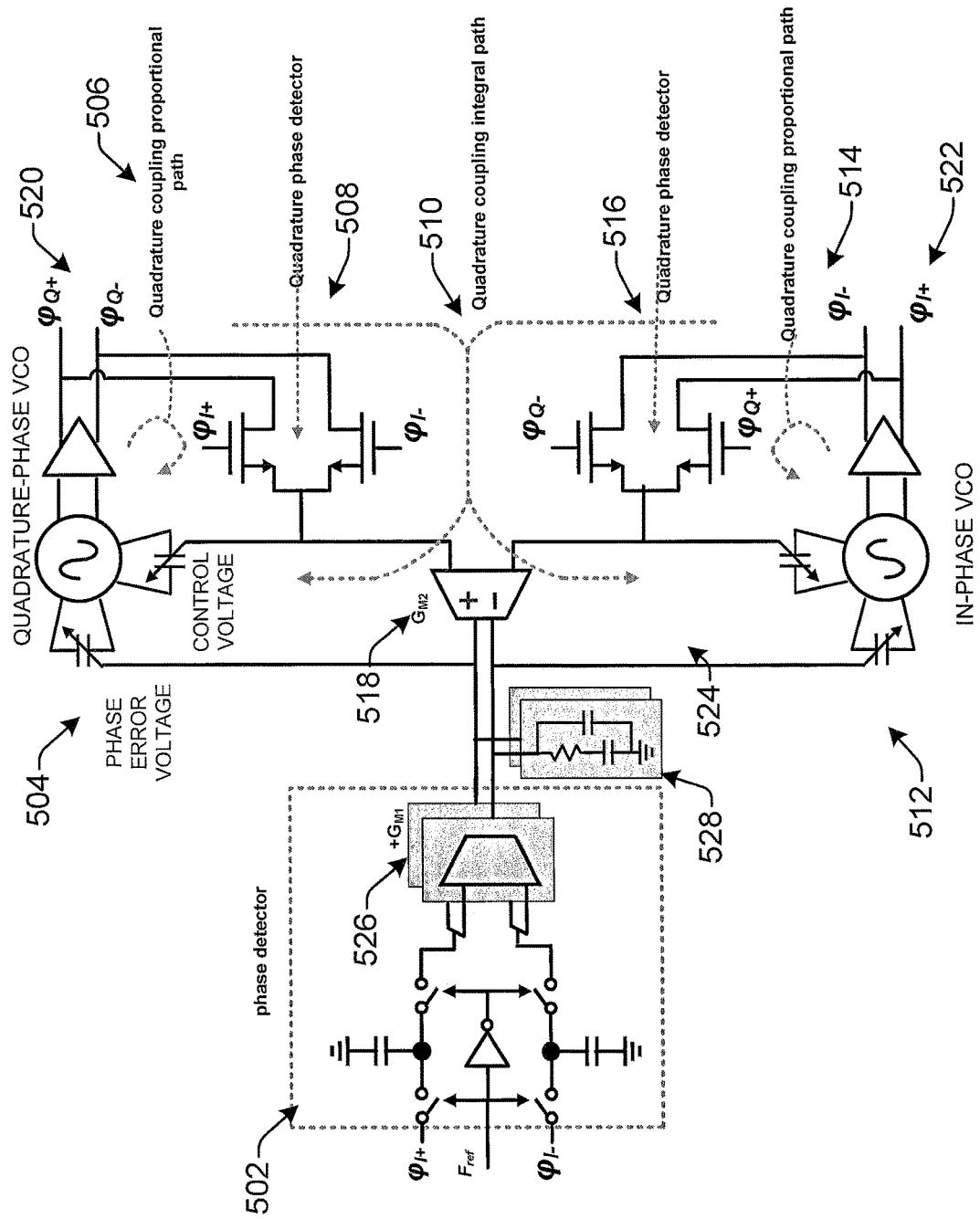
FIG. 5 is a diagram illustrating an arrangement for a quadrature VCO based local oscillator (LO) system in accordance with some embodiments and/or aspects.

FIG. 5 is a diagram illustrating an arrangement for a quadrature VCO based local oscillator (LO) system 500 in accordance with some embodiments and/or aspects. The system 500 is provided for illustrative purposes and it is appreciated that suitable variations of the system 500 are contemplated.

The system 500 can be implemented in front end circuitry, such as the radio front end module 115, the radio front end module 215, the radio front end module 300, the radio front end module 325 and variations thereof. The system 500 can be used with user device 100, a base station or infrastructure equipment radio head 200 and the like.

In a Quadrature type VCO, two VCOs are coupled using a coupling network that enforces a 90 degree phase relationship at its output. The coupling networks can be designed in a variety of suitable ways, such as using parallel-coupling.

The system 500 is a quadrature type VCO and utilizes an explicit quadrature mixer based phase detector to sense a phase difference between quadrature VCO outputs (520, 522). The phase detector detects the quadrature phase error between the VCO outputs and corrects it using two type-2 loop filters to control each VCO control voltage individually. The quadrature mixer based phase detector, the Gm2 and the type-2 loop filter form a quadrature coupling integral path (510), locks a 90 degree phase difference between its inputs and forms negative feedback for one phase progression while forming positive feedback for another phase progression.

This phase locking and feedback facilitates the correct quadrature phase relationship for start-ups across variations in process, voltage, and/or temperature (PVT) without requiring a start-up circuit. Additionally, the phase noise at the system output is reduced, for example by 3 dB, due to coupling between both VCO through the quadrature phase detector. Additionally, mismatch(s) between VCO tanks can be corrected by the type-2 loop filter and results in different varactor control voltage.

The system 500 includes a phase detector 502, a first VCO 504, a second VCO 512, a first quadrature coupling proportional path 506, a first quadrature phase detector 508, a quadrature coupling integral path 510, a second quadrature coupling proportional path 514 and a second quadrature phase detector 516.

The phase detectors 508 & 516 are quadrature mixer based phase detector and are configured to sense a phase difference between outputs of the first VCO 504 and the second VCO 512.

Loop filters, such as filters 528, can be configured to drive each VCO fine frequency control separately through a PLL path or main path and quadrature coupling integral path (510) as shown. The main path connects the outputs of the phase detector 502 with fine frequency controls of the VCOs 504 and 512.

The VCO fine frequency controls are provided control voltages 530, 532, 534 and 536 as shown.

The first and second VCOs 504 and 512 include two fine frequency controls that utilize varactors and are controlled by the loop filters and quadrature phase detectors 508 and 516 respectively.

The outputs from the VCOs 504 and 512 are compared to generate an error voltage, which is applied to varactor/VCO fine frequency controls forming quadrature coupling proportional paths 506 and 514.

At steady state, the mixer based phase detector 508 & 516 generally provides zero error if the input phase difference between the VCO outputs is either +/−90 degrees. The error voltage 518 is also essentially zero if there is zero error. However, due to image rejection properties of quadrature phase detectors and the like, one of the phase progressions forms negative feedback while the other forms positive feedback. In steady state, the VCOs 504 and 512 typically lock to phase progression with negative feedback which provides well defined phases at quadrature outputs 520 and 522. Further, the VCOs 504 and 512 lock to phase progression without a start-up circuit.

Aside from VCO tank mismatches, the proportional paths 506 and 514 are suitable to generate substantially error free quadrature phases. Mismatches between the tanks can cause different VCO running oscillation frequencies, which can be corrected by a differential varactor control voltage applied through the quadrature proportional path. This results in static quadrature phase error, which is proportional to differential control voltage and tank mismatch. Thus, a type-II quadrature control through Quadrature coupling integral path is used to generate the differential varactor control voltage without causing any phase error at the phase detector input.

The type II loop is formed by integrating differential current resulting from phase error using transconductors $G_{M2}$ in type-2 loop filters driving each VCO fine frequency controls. A PLL loop filter is split into the two (identical) filters to control each VCO control voltage individually. The output current from $G_{M2}$ is fed differentially to the loop filters producing differential VCO control voltage to compensate mismatch in the VCO resonance frequencies.

The main PLL includes a phase detector 502 to compare the phase error between low frequency reference clock and in-phase VCO output 520 and the resultant current is fed as common mode to both loop filters.

The phase error or phase error control voltage provided to the VCO 504 typically includes or is based on errors from both the PLL and the QLL.

The phase detector 502 is a subsampling phase detector of the main PLL.

The phase detectors 508 & 514 are phase detector used in the QLL loop.

The quadrature-phase VCO is locked to the reference clock indirectly by both PLL and quadrature locked loop (QLL). In this example, a sub-sampling phase detector 502 is used, however, it is appreciated that other suitable phase detectors can be employed.

The bandwidth of QLL is determined by phase detector gain (508/514) and VCO gain in proportional path. As both VCOs are coupled, within the QLL bandwidth, the phase noise at the output is 3 dB lower compared to individual VCO and outside the bandwidth, the output phase noise is same as from individual VCO. The QLL bandwidth is chosen larger than PLL bandwidth to achieve lower VCO phase noise within PLL bandwidth. It leads to lower in-band phase noise from both loop filter and reference clock as the PLL bandwidth can be reduce with reduction in VCO phase noise component.

It is appreciated that the system 500 is provided for illustrative purposes and that suitable variations are contemplated.

Figure 6:
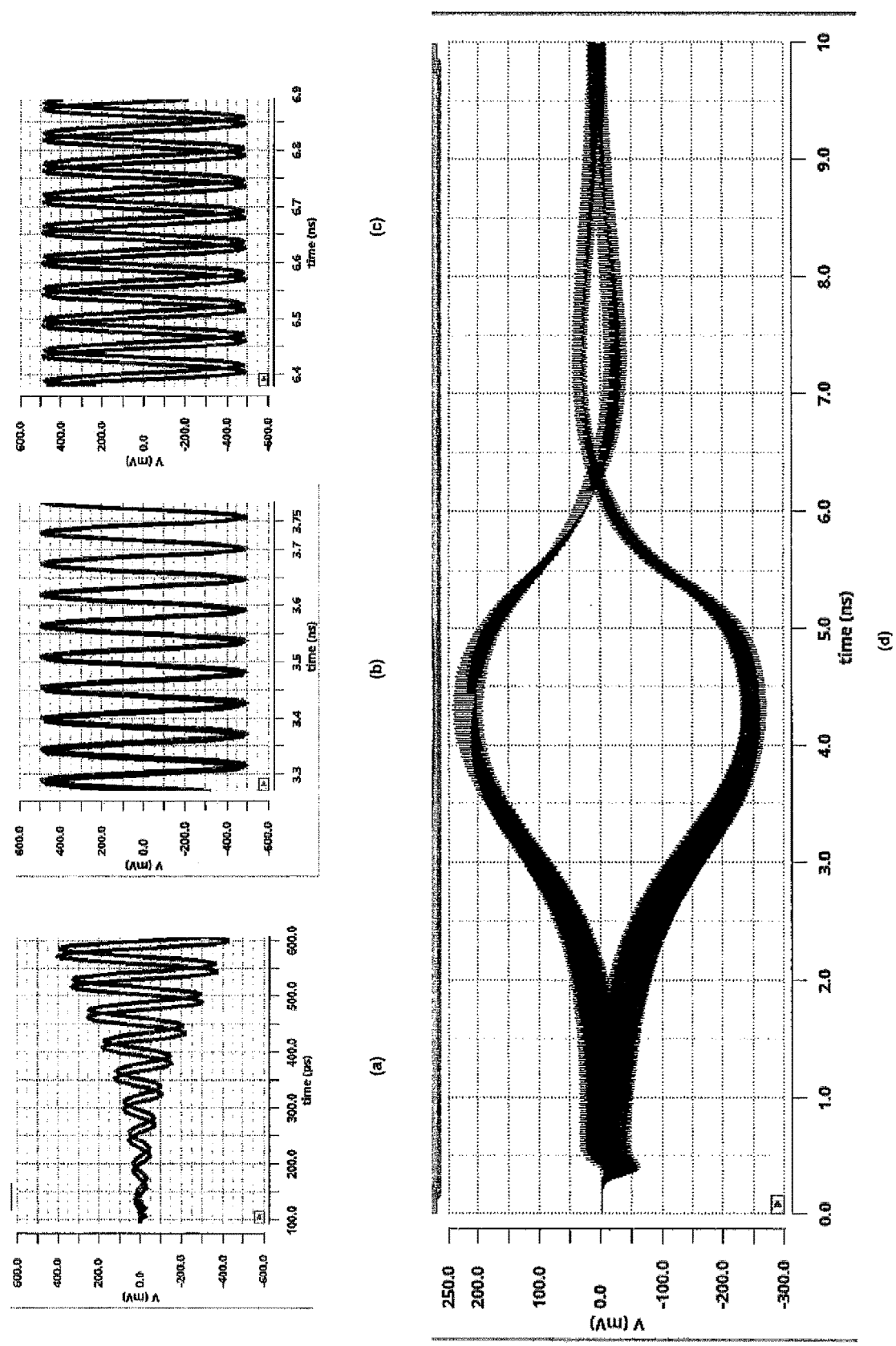
FIG. 6 includes graphs illustrating example locking using a quadrature VCO based LO in accordance with some embodiments.

FIG. 6 includes graphs 600 illustrating example locking using a quadrature VCO based LO in accordance with some embodiments. The system 500, described above, can be used to generate the example locking.

The examples shown are for illustrative purposes and it is appreciated that signals and locking are contemplated.

The graphs 600 depict time in nano-seconds (ns) or pico-seconds (ps) along an x-axis and voltage along a y-axis. The graph shows VCO outputs 520 and 522 and VCO control voltages as phase locking is performed using the quadrature VCO based LO.

Graph (a) depicts the VCO outputs where incorrect initial quadrature phases with quadrature phase leading in phase output by 90 degrees at startup.

Graph (b) depicts example VCO outputs where both outputs have the same phase after 3.5 nano seconds (ns).

Graph (c) depicts example VCO outputs to correct quadrature phases where the quadrature phase lags in-phase output by 90 degrees after 8 ns.

Graph (d) shows example varactor control voltages of the quadrature lock loop for VCOs 504 and 512.

For graph (a), both VCOs start with wrong phase relationship with quadrature-phase leading in-phase by 90 degree as shown. Although the initial resulting phase error and proportional path varactor voltage are zero (d), due to positive feedback from quadrature phase detector this is an unstable state. As a result, both varactor control voltages (shown in (d)) diverge until the correct phase relationship is establish at the quadrature outputs after 8 ns as shown in (a), (b), and (c).

Figure 7:
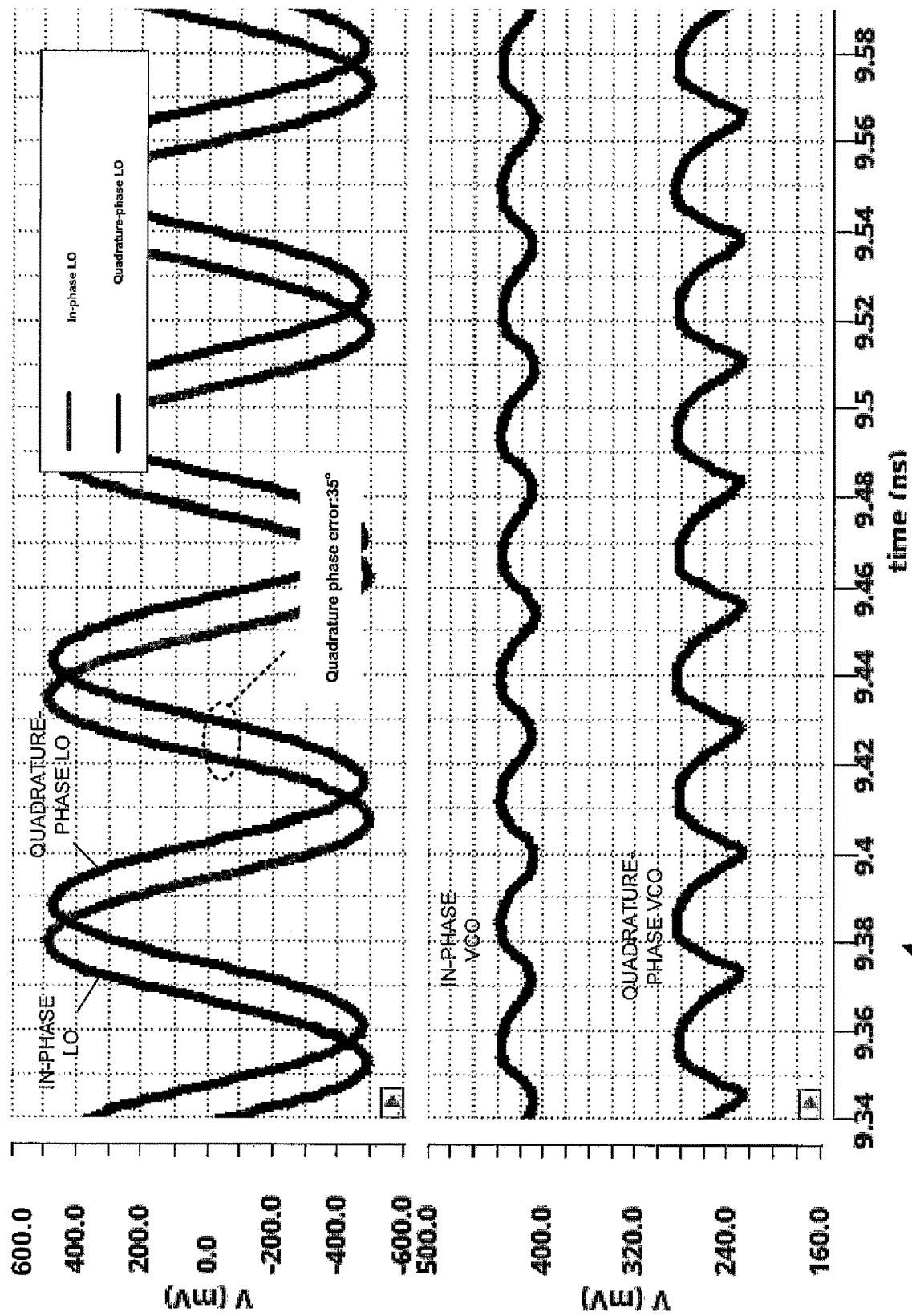
FIG. 7 is a graph illustrating example locking using a quadrature VCO based LO in accordance with some embodiments.

FIG. 7 is a graph 700 illustrating example locking using a quadrature VCO based LO in accordance with some embodiments. The system 500, described above, can be used to generate the example.

The examples shown are for illustrative purposes and it is appreciated that signals and locking are contemplated.

The graph 700 depicts time in nano-seconds (ns) along an x-axis and voltage in mili-volts (mV) along a y-axis. The graph shows VCO outputs 520 and 522 and VCO control voltages as phase locking is performed using the quadrature VCO based LO.

In the absence of an integral path, a quadrature based VCO (QVCO) can be very sensitive to large phase error resulting from mismatch in LC tanks.

The graph 700 shows a resultant quadrature phase error of 35 degree with 0.6% capacitor mismatch when only a quadrature proportional path is present.

The mismatch between the tanks is compensated by different varactor voltages and large static phase error as in a type-1 control feedback, the frequency correction is proportional to phase error.

Figure 8:
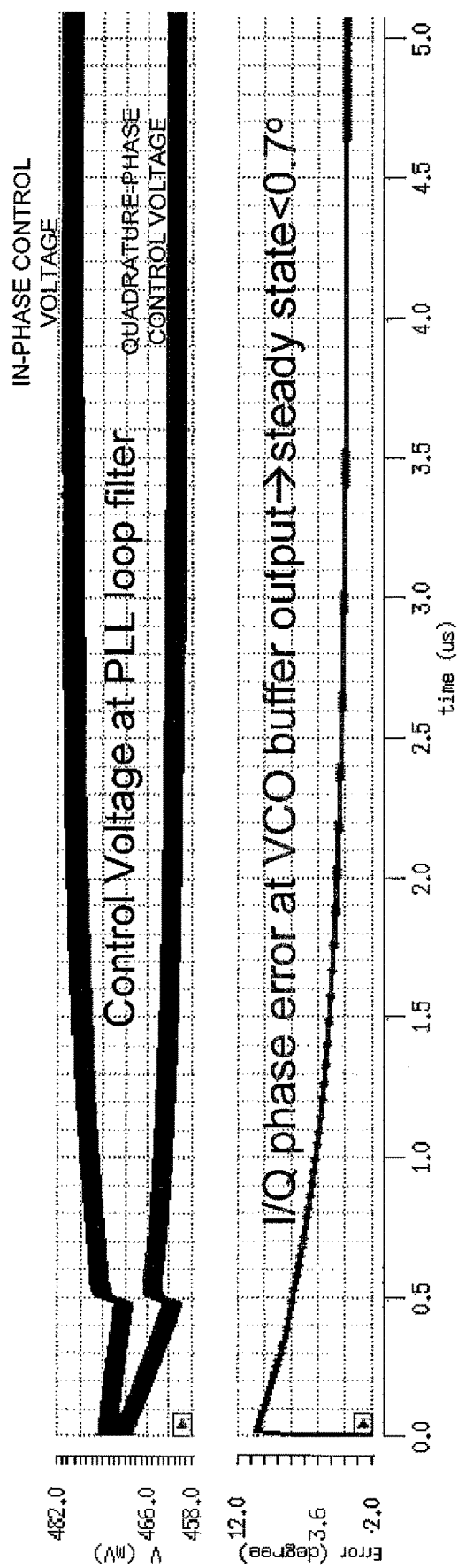
FIG. 8 is a graph illustrating example signals using a quadrature VCO based LO in accordance with some embodiments.

FIG. 8 is a graph 800 illustrating example signals using a quadrature VCO based LO in accordance with some embodiments. The system 500, described above, can be used to generate the example signals.

The examples shown are for illustrative purposes and it is appreciated that signals and locking are contemplated.

The graph 800 depicts time in micro-seconds along an x-axis and voltage in mili-volts (mV) along a y-axis. The graph shows VCO outputs 520 and 522 and VCO control voltages as phase locking is performed using the quadrature VCO based LO.

The graph 800 depicts control voltages at the PLL loop filters for phase and in-phase and IQ phase error at a VCO buffer.

In this example, both VCOs 504 and 512 attain phase locking through QLL proportional path in less than 5 ns with an initial phase error larger than 10 degree. The control voltages at the loop filters output are driven by common mode feedback from the PLL and differential mode feedback from QLL resulting in different frequency controls for the VCOs 504 and 512. The varied control voltages are the result of correction applied for mismatch between the VCO tanks. The PLL achieves phase locking in 500 ns and the quadrature phase error reduced to steady state 0.7 degree error in less than 4 us.

Figure 9:
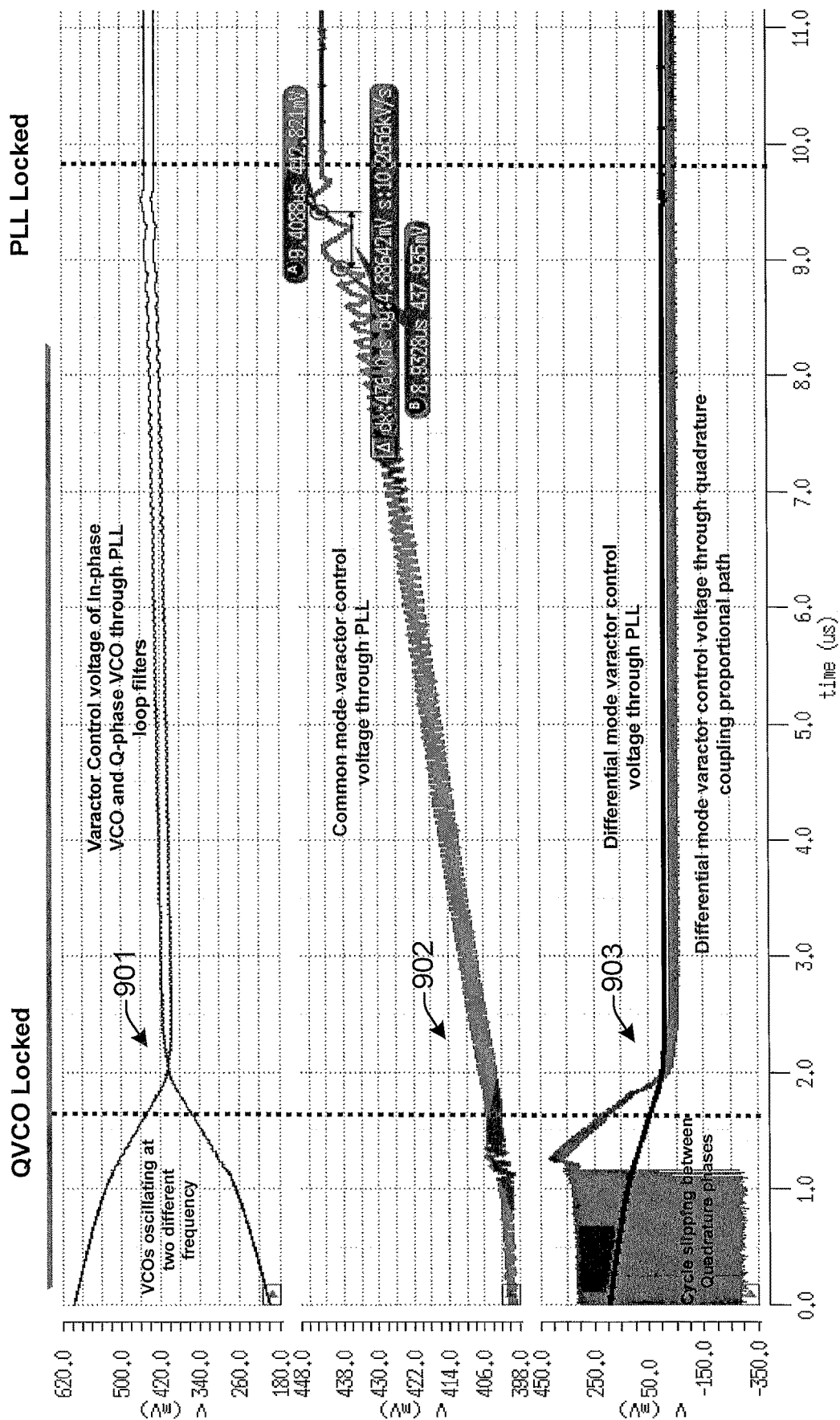
FIG. 9 is a graph illustrating example signals using a quadrature VCO based LO in accordance with some embodiments.

FIG. 9 is a graph 900 illustrating example signals using a quadrature VCO based LO in accordance with some embodiments. The system 500, described above, can be used to generate the example signals.

The examples shown are for illustrative purposes and it is appreciated that signals and locking are contemplated.

The graph 900 depicts time in micro-seconds along an x-axis and voltage in mili-volts (mV) along a y-axis.

The graph 900 shows VCO control voltages 901, common mode varactor control voltages 902, and differential mode varactor control voltages 903 during an example simulation.

A first portion of the graph 900 shows the control voltages until the QVCO is locked. In this portion, the VCOs are oscillating at two different frequencies.

In the second portion of the graph 900, the PLL becomes locked. The VCO control voltages 901 are stabilized. The common mode varactor control voltage oscillates and settles once the PLL is locked.

The transient simulation is performed to verify interaction with a PLL by initialing differences in control voltage of VCOs 0.4V in the control voltages of the VCOs, which corresponds to large free running frequency mismatch (>300 MHz) as shown.

The large frequency mismatch causes cycle slipping at a quadrature phase detector and this might have locking problem if type-1 loop filter or only proportional quadrature coupling is used. The QVCO of system 500 can correct large mismatches in frequency as the locking range of a type-II QLL is larger than if only proportional path is used for quadrature coupling. The proposed design acquires quadrature locking in 1.7 μs after few cycle slipping and acquires phase locking with reference clock in 10 μs.

Figure 10A:
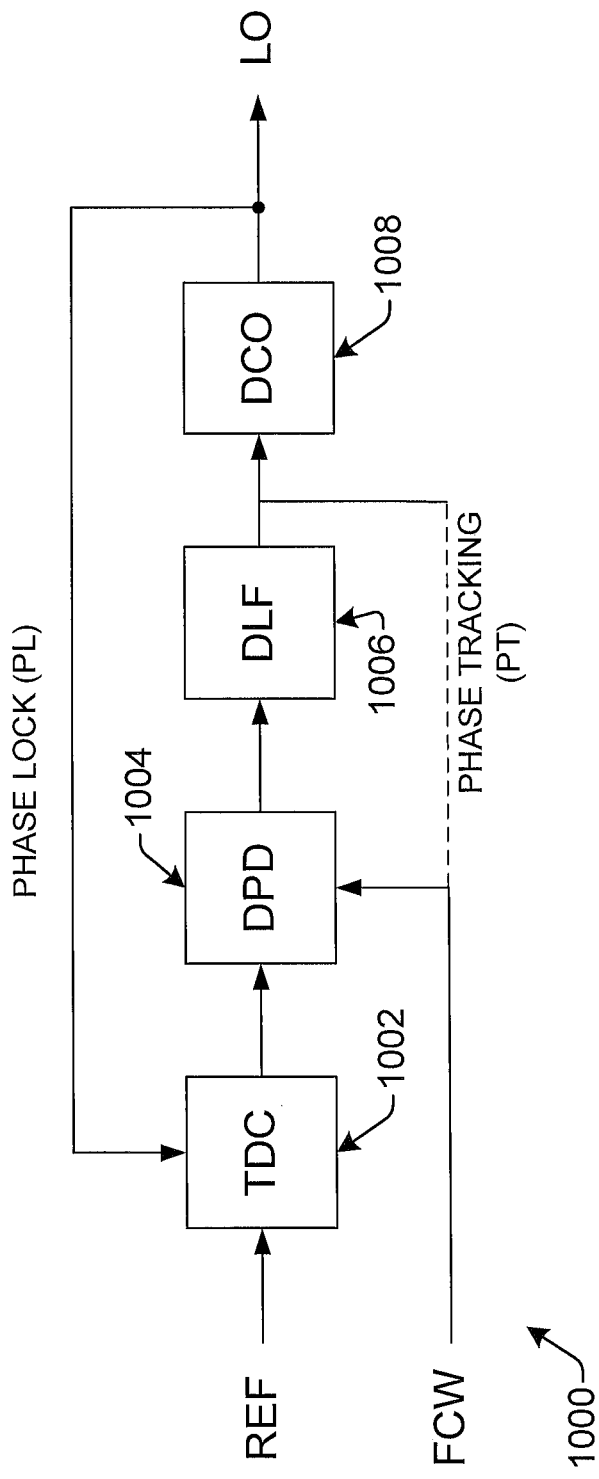
FIG. 10A is a diagram illustrating an arrangement for an all-digital phase-locked loop (ADPLL) system in accordance with some embodiments and/or aspects.

FIG. 10A is a diagram illustrating an arrangement for an all-digital phase-locked loop (ADPLL) system 1000 in accordance with some embodiments and/or aspects. It is appreciated that suitable variations to the system 1000 are contemplated.

The system 1000 includes a time to digital converter (TDC) 1002, a digital phase detector (DPD) 1004, a digital loop filter (DLF) 1006, and a digitally controlled oscillator (DCO) 1008.

The system 1000 is configured to infer a relative (to REF signal) phase of the DCO 1008 from a TDC measurement, compute a phase error in relation to a desired phase slope as dictated or based by a frequency control word (FCW) in the DPD 1004, filter the resulting/computed phase error by the DLF 1006 and adjust the frequency of the DCO 1008 to counteract or mitigate the resulting/computed phase error.

The DCO 1008 can be configured to provide piecewise continuous control over its output frequency, at the LO. However, when suitable controls are unavailable, direct phase locking may be unachievable.

The system 1000 can be configured to include and/or utilize phase tracking (PT) performed by a lower loop. Additional details of the phase tracking are provided below.

The system 1000 can be implemented in front end circuitry, such as the radio front end module 115, the radio front end module 215, the radio front end module 300, the radio front end module 325 and variations thereof. The system 1000 can be used with user device 100, a base station or infrastructure equipment radio head 200 and the like.

Figure 10B:
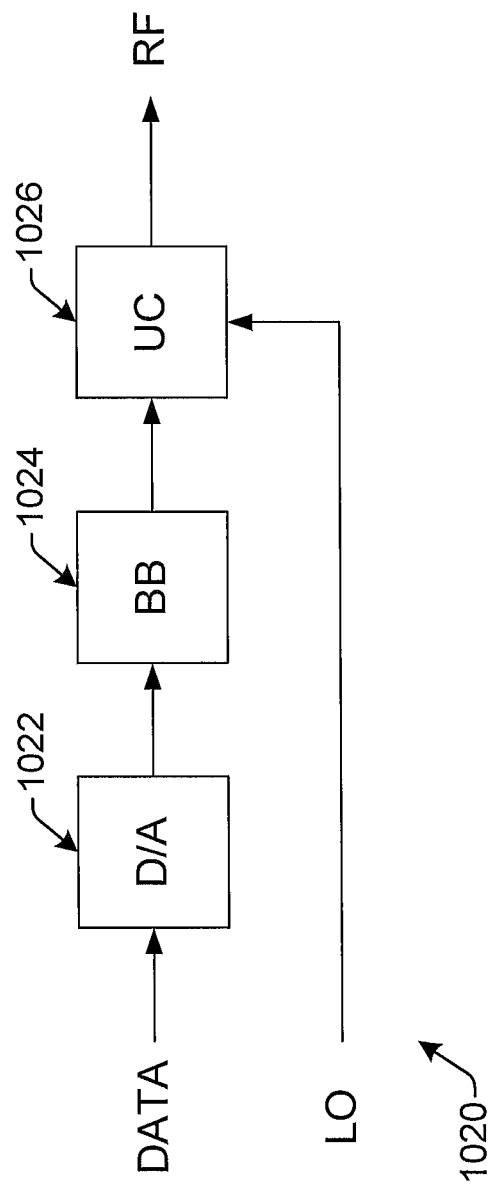
FIG. 10B is a diagram illustrating an example of a suitable transmitter in accordance with some embodiments and/or aspects.
Figure 10C:
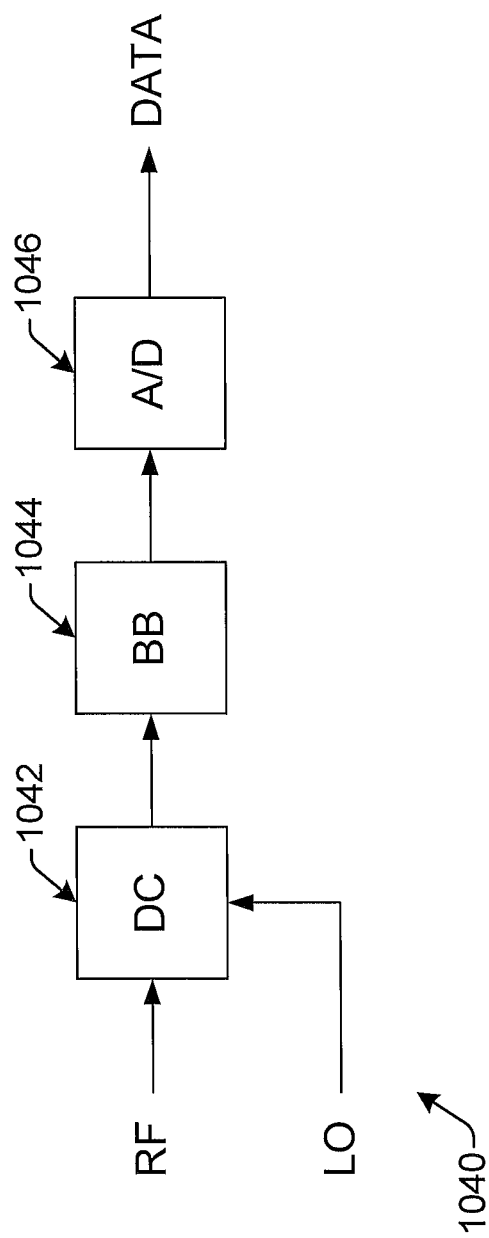
FIG. 10C is a diagram illustrating an example of a suitable receiver in accordance with some embodiments and/or aspects.

More particularly, system 1000 can be employed for LO signal generation to be employed in a transmitter 1020 and/or a receiver 1040 systems such as presented in FIG. 10B and FIG. 10C respectively.

FIG. 10B is a diagram illustrating an example of a suitable transmitter 1020 in accordance with some embodiments and/or aspects. The transmitter 1020 is provided as an example and it is appreciated that suitable variations are contemplated.

The transmitter 1020 can be used with the all-digital phase-locked loop (ADPLL) system 1000.

The transmitter 1020 includes a Digital-to-Analog converter 1022, analog baseband (BB) circuitry 1024 and an Up-Converter 1026. The analog BB circuitry follows the converter 1022. The Up-converter 1026 is configured to place transmitted data in a pre-allocated part of a spectrum employing mixing with the LO.

A DATA signal incident at the input of 1022 is typically a stream of multi-bit digital words.

FIG. 10C is a diagram illustrating an example of a suitable receiver 1040 in accordance with some embodiments and/or aspects. The receiver 1040 is provided as an example and it is appreciated that suitable variations are contemplated.

The receiver 1040 can be used with the all-digital phase-locked loop (ADPLL) system 1000.

The receiver 1040 includes a frequency down-conversion block 1042, which uses an LO signal to mix-down the incoming transmission, followed by some analog base-band (signal conditioning) circuitry 1044 and ends with an analog to digital converter 1046. The resulting output (DATA) is also commonly a stream of multi-bit digital words.

For both the receiver 1020 and the transmitter 1040, a stable LO signal can provide relatively high signal-to-noise characteristics for communications and permit adherence to stringent signal-to-noise requirements (typically required in modern communication standards as well as many other RF applications) at the system's output.

Figure 11B:
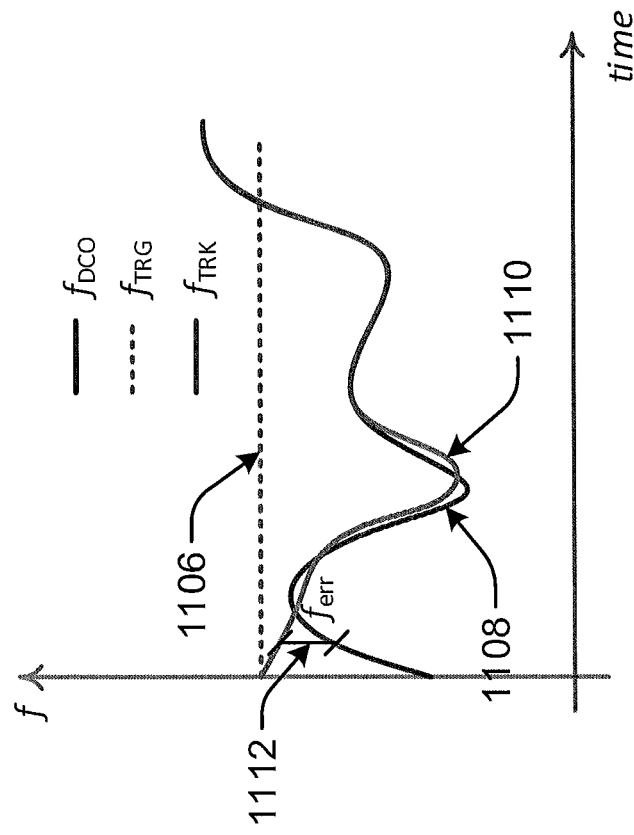
FIGS. 11A and 11B provide examples of dual mode ADPLL generated signals in accordance with one or more aspects or embodiments.
Figure 11A:
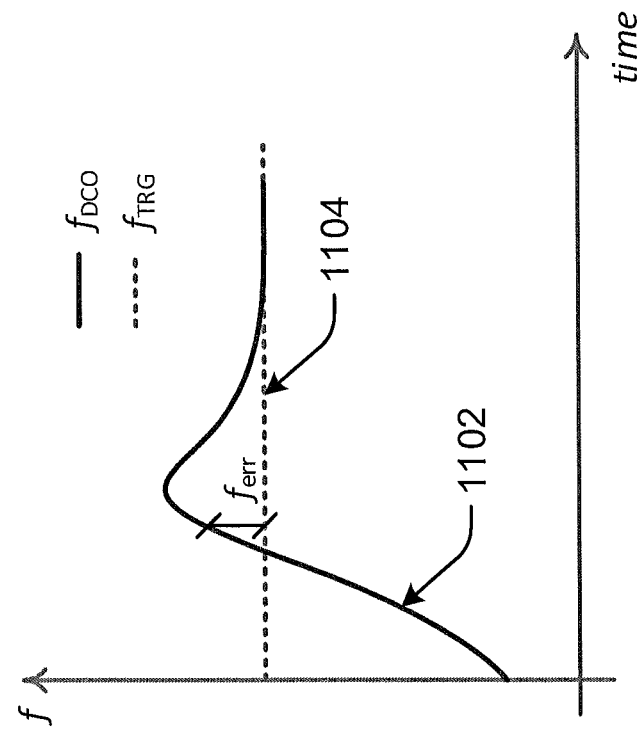

FIGS. 11A and 11B provide examples of dual mode ADPLL generated signals in accordance with one or more aspects or embodiments. The signals are provided for illustrative purposes and it is appreciated that other signals and values can be generated and/or utilized.

FIGS. 11A and 11B depict time along an x-axis and frequency along a y-axis.

Phase locking of the LO signal to a stable reference source is can be used to provide stability characteristics from REF to LO. For this, a control loop is employed to tune the frequency of the DCO until its phase path coincides with the phase path dictated by the required target frequency and the REF clock. Under such conditions, the frequency of the DCO will coincide with the target frequency ($f_{TRG}$). This situation is depicted schematically in FIG. 11A.

After some locking transient, the DCO frequency 1102 is locked to the target frequency 1104. A pre-requisite for achieving such locking is continuous (or at least piecewise-continuous) frequency tunability of the DCO (the LO source) which typically comes at a price of performance concessions, introduced parasitics and the like.

It is appreciated that the frequency produced by the DCO can be tracked and an instantaneous phase or frequency error can be reported to an transmitter, receiver and the like instead of using a piecewise-continuous frequency tunable DCO. A depiction of this situation is provided in FIG. 11B. After some transient, a tracking frequency 1110 catches up with a DCO frequency 1108. The DCO frequency 1108 may never become exactly the target frequency $f_{TRG}$ but the reporting/reported frequency error 1112 does vanish (on average) eventually.

Figure 12A:
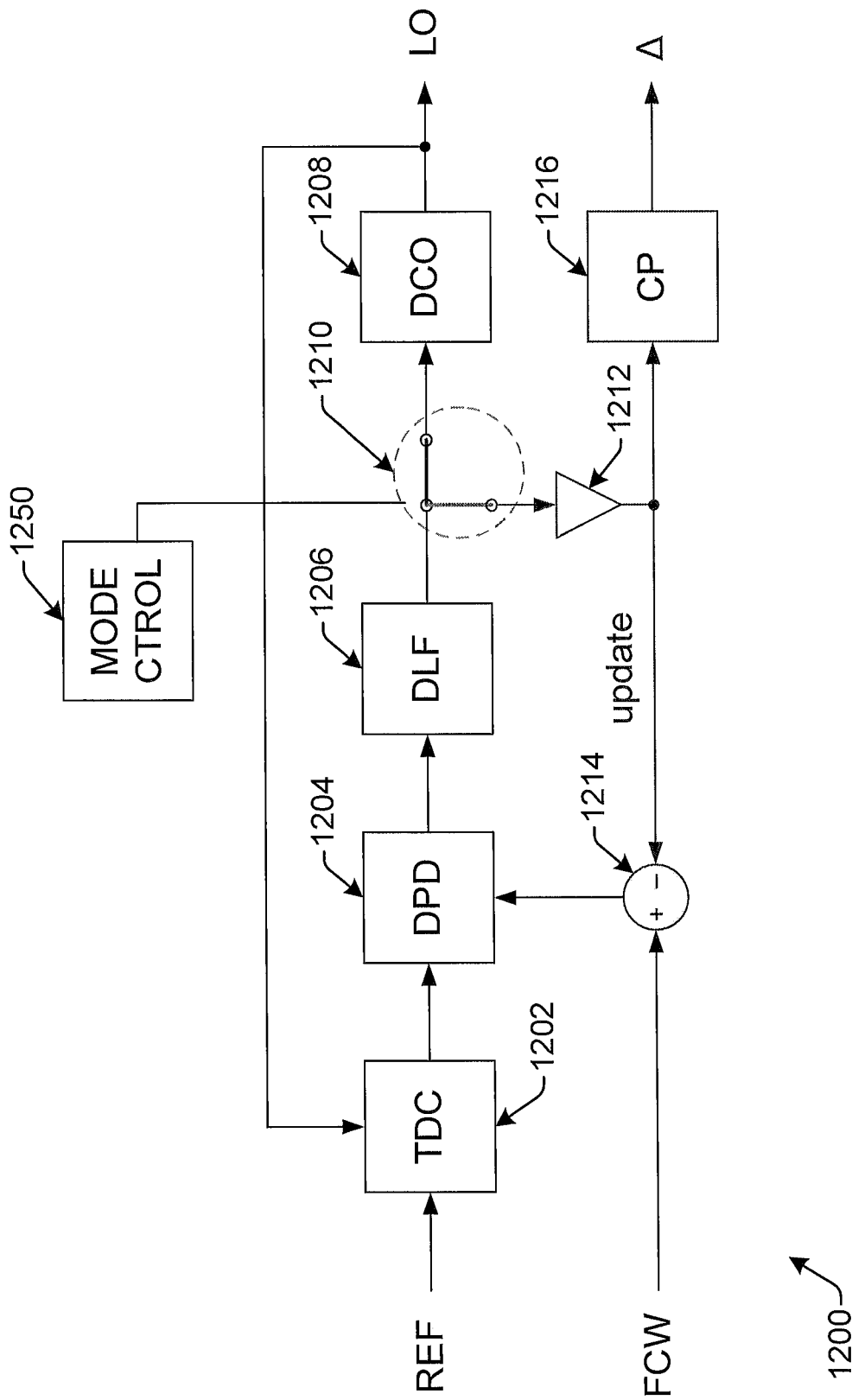
FIG. 12A, illustrates a dual mode system, which allows operating in both phase-locked (PL) and phase-tracking (PT) mode in accordance with one or more aspects or embodiments.

FIG. 12A, illustrates a dual mode system 1200, which allows operating in both phase-locked (PL) and phase-tracking (PT) mode in accordance with one or more aspects or embodiments.

The system 1200 includes a time to digital converter (TDC) 1202, a digital phase detector (DPD) 1204, a digital loop filter (DLF) 1206, and a digitally controlled oscillator (DCO) 1208. The system 1000 can be referenced for additional description of these elements.

The system 1200 also includes a mode switch 1210, a digital gain 1212, a digital FCW update mechanism 1214 and a digital compensation processor 1216.

The switch 1210 is configured to select and/or switch between a phase-locked (PL) loop mode of operation and phase tracking (PT) loop modality. For the phase-locked loop mode, the switch 1210 connects an output of the DLF 1206 to an input of the DCO 1208 and disconnects the output of the DL from a phase tracking (PT) loop.

In one example, the PT mode can be considered as generating a coarsely locked signal in a first stage while producing a frequency error signal and/or phase compensation. The phase compensation can be subsequently used in a second or later stage to phase lock with a generated LO signal.

For the phase-tracking (PT) mode, the switch 1210 disconnects the output of the DLF 1206 from the input of the DCO 1208 and connects the output of the DLF 1206 to the phase tracking loop. The phase tracking loop connects to the DPD 1204 for a DCO frequency control for the phase-locked loop mode and to a frequency control word update logic the phase tracking loop modality.

The phase tracking loop includes an amplifier 1212, a combiner circuit 1214 and a compensation processor (CP) circuit 1216. In one example, the CP circuit 1216 is a digital integrator or accumulator, however it is appreciated that other suitable elements can be employed. The amplifier receives the filter output and provides the filter signal to the circuit 1214 and the CP 1216. The circuit 1214 updates the frequency control word (FCW) provided to the DPD 1204. The CP circuit 1216 generates an (instantaneous) phase or frequency error and provides or reports the frequency error. FIG. 11B illustrates an example of this mode.

Figure 12B:
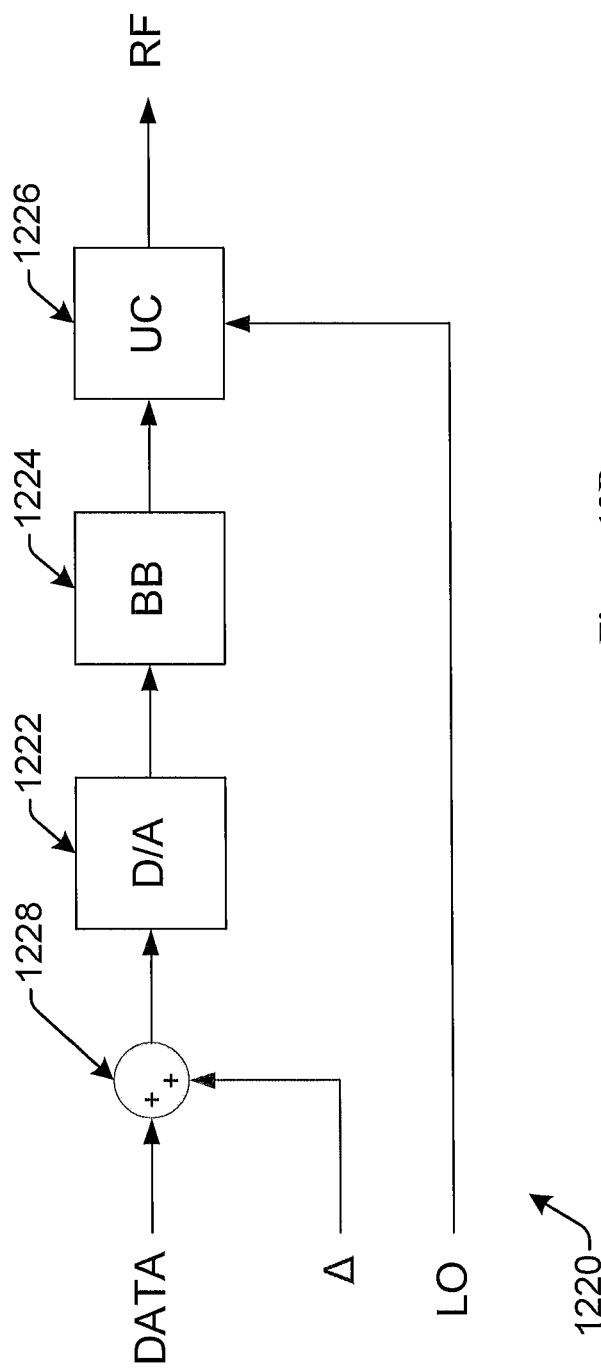
FIG. 12B is a diagram illustrating an example of a suitable transmitter in accordance with some embodiments and/or aspects.

FIG. 12B is a diagram illustrating an example of a suitable transmitter 1220 in accordance with some embodiments and/or aspects. The transmitter 1020 is provided as an example and it is appreciated that suitable variations are contemplated.

The transmitter 1220 can be used with the all-digital phase-locked loop (ADPLL) system 1200.

The transmitter 1220 includes a Digital-to-Analog converter 1222, analog baseband (BB) circuitry 1224 and an Up-Converter 1226. The analog BB circuitry follows the converter 1222. The Up-converter 1226 is configured to place transmitted data in a pre-allocated part of a spectrum employing mixing with the LO.

A DATA signal is combined with a reported frequency error at the combiner circuit 1228. The frequency error is received from the phase tracking loop of FIG. 12A. The combined data signal is then incident at the input of converter 1222.

Figure 12C:
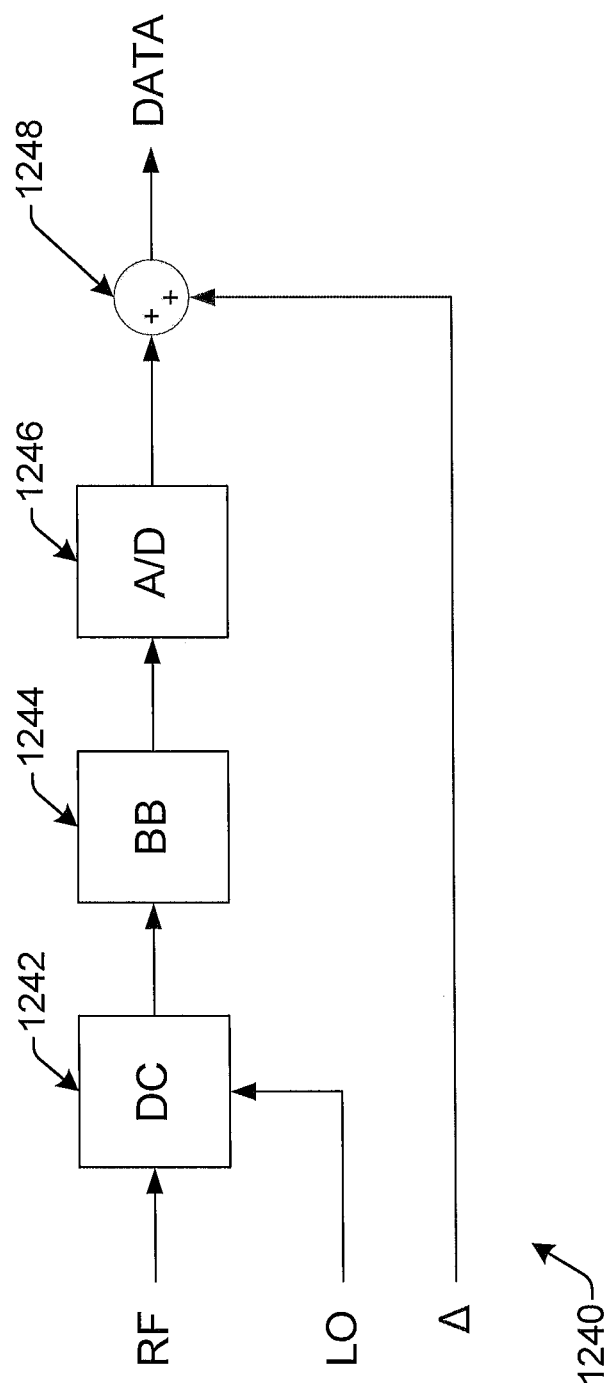
FIG. 12C is a diagram illustrating an example of a suitable receiver in accordance with some embodiments and/or aspects.

FIG. 12C is a diagram illustrating an example of a suitable receiver 1240 in accordance with some embodiments and/or aspects. The receiver 1240 is provided as an example and it is appreciated that suitable variations are contemplated.

The receiver 1240 can be used with the all-digital phase-locked loop (ADPLL) system 1200.

The receiver 1240 includes a frequency down-conversion block 1242, which uses an LO signal to mix-down the incoming transmission, followed by some analog base-band (signal conditioning) circuitry 1244 and ends with an analog to digital converter 1246. The output of the converter 1246 is combined with the frequency error by the combiner circuit 1248. The resulting output (DATA) is also commonly a stream of multi-bit digital words.

Figure 13:
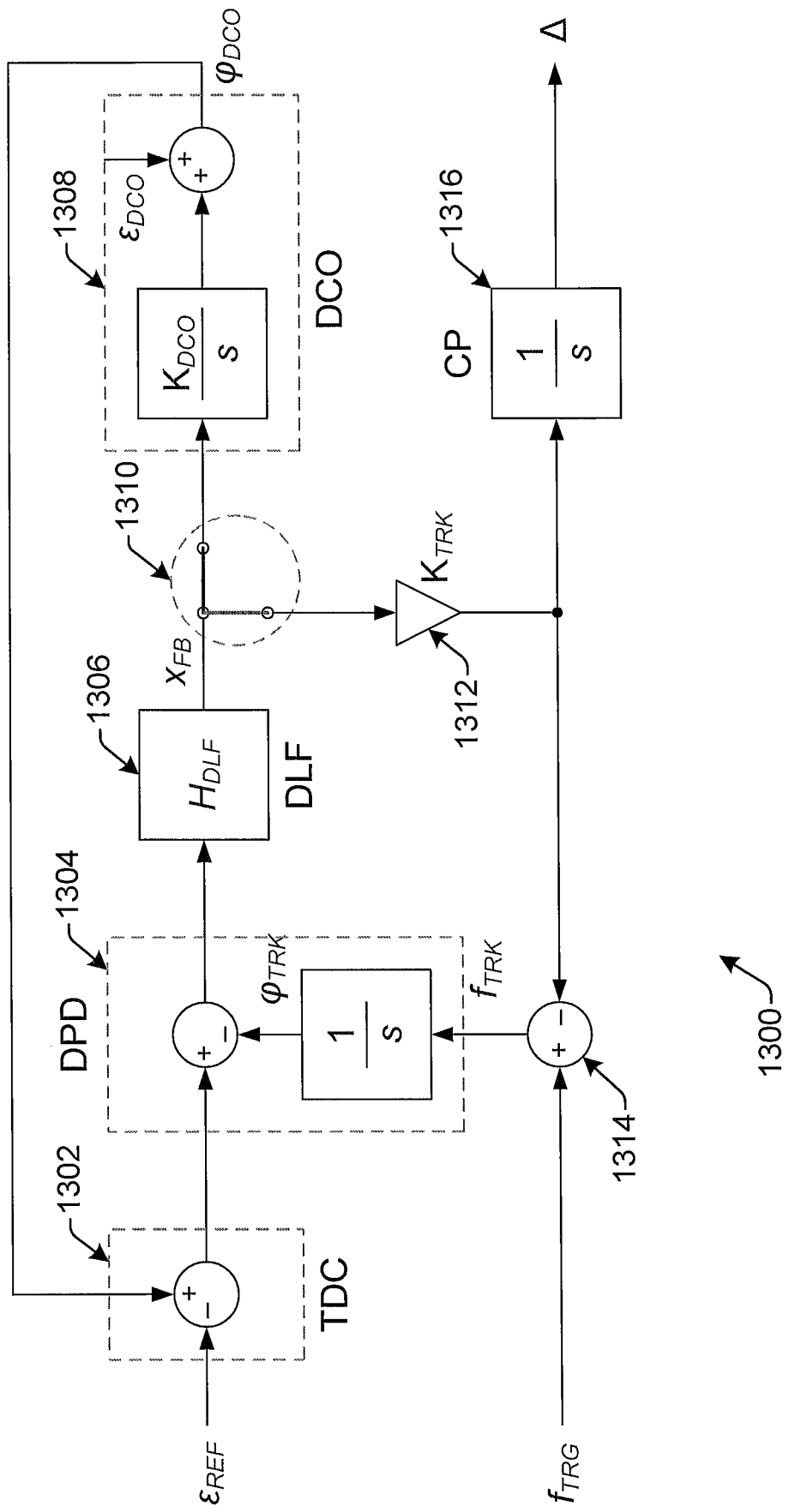
FIG. 13 depicts an all digital phase locked loop (ADPLL) system in accordance with one or more embodiments or aspects.

FIG. 13 depicts an all digital phase locked loop (ADPLL) system 1300 in accordance with one or more embodiments or aspects. The system 1300 is equivalent to 1200, but illustrates phase domain analysis, and specifically for derivation of phase transfer functions and computation of total phase noise power spectral densities (PSD) at different points across the system.

The system 1300, similar to the system 1200, includes a TDC 1302, a DPD 1304, a DLF 1306, a switch 1310, a DCO 1308, a PT amplifier 1312, a PT combiner circuit 1314 and a CP circuit 1316.

The below analysis shows a substantial equality between the phase transfer functions and phase noise power spectral densities resulting from both phase-locked and phase-tracking modes of operation.

A reference input phase noise PSD is denoted $\varepsilon_{REF}$ and a DCO contributed phase noise PSD is $\varepsilon_{DCO}$.

In the phase-locked mode, the switch is in the upper position and hence the output of the digital loop filter (DLF) 1306, the $x_{FB}$, is fed back into the frequency control of the DCO 1308. In this mode, $f_{TRK}=f_{TRG}$ (tracking frequency is equal to the target frequency—as defined by FCW in 1200—and is constant) and hence the tracking phase is $$\varphi_{TRK} = \frac{1}{s} f_{TRK} = \frac{1}{s} f_{TRG} \stackrel{\Delta}{=} \varphi_{TRG} \qquad (1)$$

Assuming the DCO 1308 is already oscillating in the vicinity of the $f_{TRG}$, and denoting phase noise related excursions out of the target phase by $\varepsilon_{DCO}$, the output phase of the DCO 1308 is then given by $$\varphi_{DCO} = \varphi_{TRG} + \varepsilon_{DCO} + [\varphi_{DCO} - \varepsilon_{REF} - \varphi_{TRG}] \cdot H_{DLF} \cdot \frac{K_{DCO}}{s} \qquad (2)$$

$$\varphi_{DCO} = \varphi_{TRG} + \varepsilon_{DCO} + [\varepsilon_{REF} + \varphi_{TRG} - \varphi_{DCO}] \cdot \left[-H_{DLF} \cdot \frac{K_{DCO}}{s}\right] \qquad (3)$$

Denoting $$H_{OL}^{PLL} = -H_{DLF} \cdot \frac{K_{DCO}}{s} \qquad (4)$$

We get $$\varphi_{DCO} = \varphi_{TRG} + \frac{H_{OL}^{PLL}}{1+H_{OL}^{PLL}} \cdot \varepsilon_{REF} + \frac{1}{1+H_{OL}^{PLL}} \cdot \varepsilon_{DCO} \quad (5)$$

And hence the DCO phase is a sum of: the prescribed target phase; the low-pass filtered version of the REF phase noise; and the high-pass filtered (DCO) phase-noise.

In the phase-tracking mode, the switch is in the lower position and the output of the DLF 1306 is added to the target frequency $$f_{TRK} = f_{TRG} - K_{TRK} x_{FB} \quad (6)$$

The feedback signal is given by $$x_{FB} = ((\varphi_{DCO} - \varepsilon_{REF} - \varphi_{TRK}) \cdot H_{DLF} \quad (7)$$

Combining the two equations above into $$\varphi_{TRK} = \frac{f_{TRK}}{s}$$

$$\varphi_{TRK} = \frac{1}{s} f_{TRK} \quad (8)$$

$$= \frac{1}{s} \cdot [f_{TRG} - K_{TRK} \cdot (\varphi_{DCO} - \varepsilon_{REF} - \varphi_{TRK}) \cdot H_{DLF}]$$

$$\varphi_{TRK} = \varphi_{TRG} + [\varphi_{DCO} - \varepsilon_{REF} - \varphi_{TRK}] \cdot \left[-H_{DLF} \cdot \frac{K_{TRK}}{s}\right] \quad (9)$$

Denoting $$H_{OL}^{PTL} = -H_{DLF} \cdot \frac{K_{TRK}}{s} \quad (10)$$

We get $$\varphi_{TRK} = \frac{1}{1+H_{OL}^{PTL}} \cdot \varphi_{TRG} + \frac{H_{OL}^{PTL}}{1+H_{OL}^{PTL}} \cdot (\varphi_{DCO} - \varepsilon_{REF}) \quad (11)$$

and $\varphi_{TRK}$ tracks (through a similar LPF) the relative (to REF) phase of the DCO. The error phase (defined as $\varphi_{err} \triangleq \varphi_{DCO} - \varphi_{TRK}$) then takes the form of $$\varphi_{err} = \varphi_{DCO} - \frac{1}{1+H_{OL}^{PTL}} \cdot \varphi_{TRG} - \frac{H_{OL}^{PTL}}{1+H_{OL}^{PTL}} \cdot (\varphi_{DCO} - \varepsilon_{REF}) \quad (12)$$

$$\varphi_{err} = \frac{1}{1+H_{OL}^{PTL}} \cdot (\varphi_{DCO} - \varphi_{TRG}) + \frac{H_{OL}^{PTL}}{1+H_{OL}^{PTL}} \cdot \varepsilon_{REF} \quad (13)$$

Re-asserting as in the PLL case that (assuming that DCO's excursions out of target phase path are described by phase noise):

$$\varphi_{DCO} = \varphi_{TRG} + \varepsilon_{DCO} \quad (14)$$

$$\varphi_{err} = \frac{1}{1+H_{OL}^{PTL}} \cdot \varepsilon_{DCO} + \frac{H_{OL}^{PTL}}{1+H_{OL}^{PTL}} \cdot \varepsilon_{REF} \quad (15)$$

This shows that the error phase is as expected from a phase-locked loop on the DCO: complementary LPF and HPF on the DCO and REF noises respectively.

Moreover, the tracking signal can be subtracted from the desired phase path (that is $\varphi_{TRG}$ of course) yielding the instantaneous distance to the target phase path $$\Delta \triangleq \varphi_{TRG} - \varphi_{TRK} \quad (16)$$

It stems from (8) that $$\varphi_{TRK} = \frac{1}{s} \cdot [f_{TRG} - K_{TRK} \cdot x_{FB}] = \varphi_{TRG} + \frac{1}{s} \cdot [-K_{TRK} \cdot x_{FB}] \quad (17)$$

and hence by substituting (17) into (16) the phase difference is given by the gain scaled integral of the DLF 1306 output $$\Delta = \frac{1}{s} \cdot [K_{TRK} \cdot x_{FB}] \quad (18)$$

FIGS. 12B and 12C depict the transmitter 1220 and receiver 1240. The transmitter 1220 can incorporate the phase distance information (18) in the transmitted signal by the circuit 1228. The receiver can incorporate the phase distance information (18) in the received signal using the circuit 1248. Taking this information into account allows to amend the LO phase (which in this case is directly the DCO phase–$\varphi_{DCO}$) with the total phase (denoted $\varphi_{out}$ hereon) resembling exactly the phase of a locked signal as in (5).

In both 1220 and 1240, it ca be assumed that $$\varphi_{out} = \varphi_{DCO} + \Delta = \varphi_{DCO} + \varphi_{TRG} - \varphi_{TRK} \quad (19)$$

$$\varphi_{out} = \varphi_{DCO} + \varphi_{TRG} - \frac{1}{1+H_{OL}^{PLL}} \cdot \varphi_{TRG} - \frac{H_{OL}^{PLL}}{1+H_{OL}^{PLL}} \cdot (\varphi_{DCO} - \varepsilon_{REF}) \quad (20)$$

$$\varphi_{out} = \frac{H_{OL}^{PLL}}{1+H_{OL}^{PLL}} (\varepsilon_{REF} + \varphi_{TRG}) + \frac{1}{1+H_{OL}^{PLL}} \varphi_{DCO} \quad (21)$$

Adjusting so that $H_{OL}^{PTL} = H_{OL}^{PLL}$ and the perturbations of the DCO phase are all self-induced ($\varphi_{DCO} = \varphi_{TRG} + \varepsilon_{DCO}$), we get complete identity to the output phase of the PLL.

$$\varphi_{out} = \frac{H_{OL}^{PLL}}{1+H_{OL}^{PLL}} (\varepsilon_{REF} + \varphi_{TRG}) + \frac{1}{1+H_{OL}^{PLL}} (\varepsilon_{DCO} + \varphi_{TRG}) \quad (22)$$

and finally $$\varphi_{out} = \varphi_{TRG} + \frac{H_{OL}^{PLL}}{1+H_{OL}^{PLL}} \varepsilon_{REF} + \frac{1}{1+H_{OL}^{PLL}} \varepsilon_{DCO} \quad (23)$$

Which closely resembles (5). Hence it can be claimed that closely tracking the DCO phase relatively to the REF clock with subsequent inclusion of this information in the transmit/receive path produces the effect of locking to REF clock.

Figure 14:
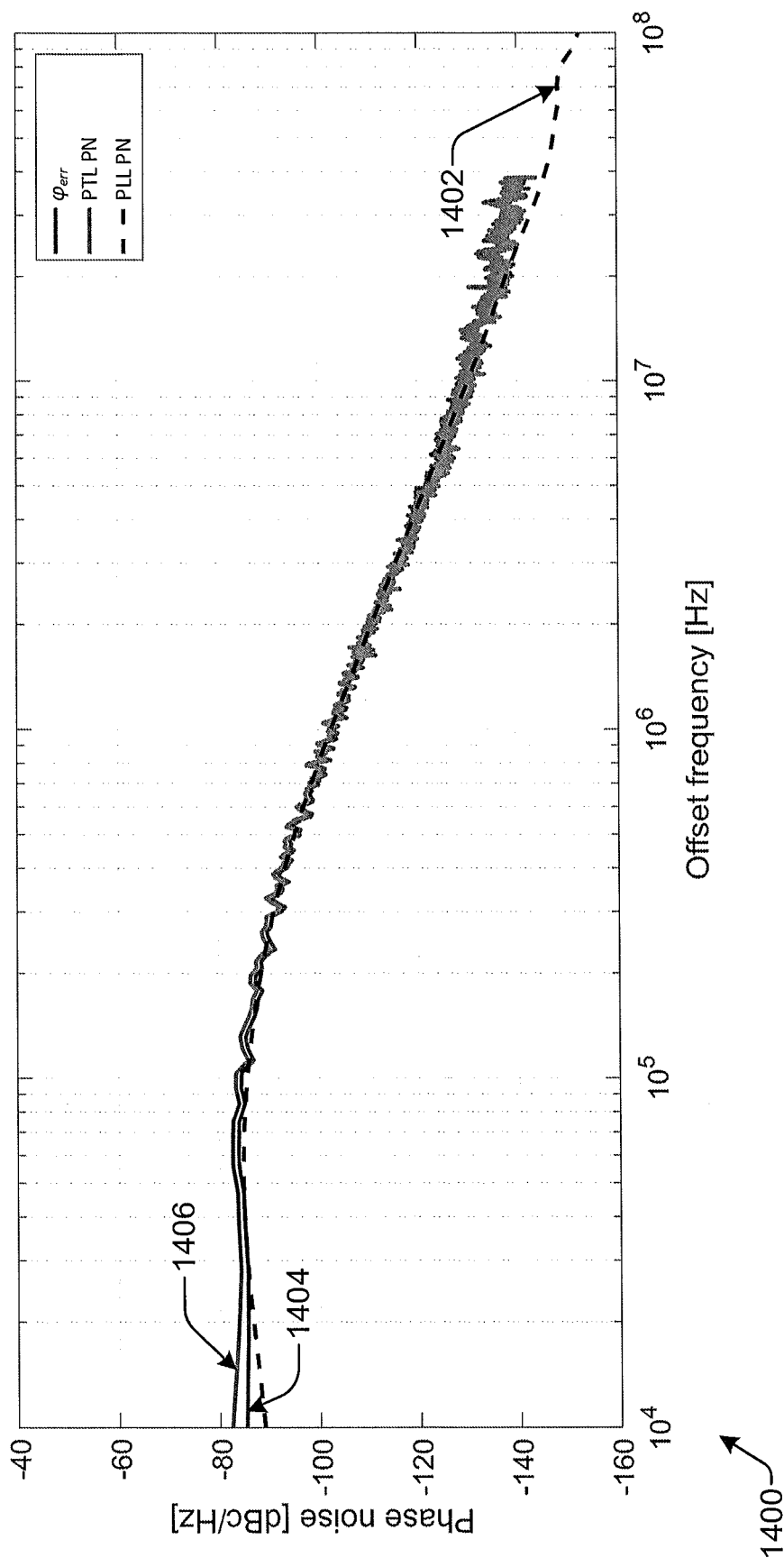
FIG. 14 is a graph illustrating a simulation of generating a local oscillator signal using phase locking (PL) or phase tracking (PT) in accordance with one or more embodiments or aspects.

FIG. 14 is a graph 400 illustrating a simulation of generating a local oscillator signal using phase locking or phase tracking in accordance with one or more embodiments or aspects.

The graph 1400 shows three curves that represent phase noise power spectral densities of system 1200 operating in phase-locking mode (1402), power spectral density of the phase error signal (13) when the system 1200 operates in phase-tracking mode (1404) and the final output phase noise (22) also taken in phase-tracking mode (1406). The output of the phase-tracking system closely tracks that of phase-locked system.

It is appreciated that the graph is provided for illustrative purposes and that other suitable signals and signal values can be generated.

The system 1200 is configured to control and switch between the phase lock (upper loop) and phase tracking (lower loop) modes. The systems 1200 can include additional circuitry, referred to as mode configuration circuitry (shown as 1250) to control and switch between the modes.

In one example, the modes are selected according to a mode configuration setting.

It is appreciated that the ADPLL systems can support various circuits, such as synthesizers. For example, some have more relaxed phase-noise requirements and serve as straight forward clock generators—either for converters or for pure digital blocks. For this example, the system (with some trade-offs between spectral purity and tunability) can be configured for phase lock (PLL) mode. In other examples, where performance is of paramount importance and the path allows to include this additional phase information, a (very) coarsely tunable oscillator can be used (simply put—only a handful of capacitors for sub-band selection) that has no varactor (analog or digital—and hence cannot phase-lock) and work in PTL mode. Thus, the mode of operation for the ADPLL system (1200) can be selected based on the tuning mechanisms existing in the oscillator being driven.

Additionally, it is appreciated that in some ASICs, there is a production test (or even some operational mode) requirement to measure a range of achievable frequencies of the DCO. Typically, long counters (>20 bits) are employed, requiring relatively long measurement cycles (>10 K REF clock cycles) to get the required resolution. The ADPLL can be used in phase tracking (PTL) mode as a precise and very fast frequency meter—this is simply because instead of having just 1 flip-flop of the counter facing the high-frequency node (DCO output) we can have hundreds (the number of TDC samplers). This essentially means that the same measurement resolution can be achieved hundred times faster. One would hence switch into PTL mode for the duration of the frequency measurement, characterize your DCO and then switch back into PLL mode for operational mode. The same criteria of convergence can be used for measurement completion as for gauging lock in a DPLL—the output of DPD should converge into a narrow symmetric sleeve around 0.

As used herein, the term "circuitry" may refer to, be part of, or include an Application Specific Integrated Circuit) ASIC, (an electronic circuit, a processor) shared, dedicated, or group), and/or memory (shared, dedicated, or group) that execute one or more software or firmware programs, a combinational logic circuit, and/or other suitable hardware components that provide the described functionality. In some embodiments, the circuitry may be implemented in, or functions associated with the circuitry may be implemented by, one or more software or firmware modules. In some embodiments, circuitry may include logic, at least partially operable in hardware.

As it employed in the subject specification, the term "processor" can refer to substantially any computing processing unit or device including, but not limited to including, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit, a digital signal processor, a field programmable gate array, a programmable logic controller, a complex programmable logic device, a discrete gate or transistor logic, discrete hardware components, or any combination thereof designed to perform the functions and/or processes described herein. Processors can exploit nano-scale architectures such as, but not limited to, molecular and quantum-dot based transistors, switches and gates, in order to optimize space usage or enhance performance of mobile devices. A processor may also be implemented as a combination of computing processing units.

In the subject specification, terms such as "store," "data store," "data storage," "database," and substantially any other information storage component relevant to operation and functionality of a component and/or process, refer to "memory components," or entities embodied in a "memory," or components including the memory. It is noted that the memory components described herein can be either volatile memory or nonvolatile memory, or can include both volatile and nonvolatile memory.

By way of illustration, and not limitation, nonvolatile memory, for example, can be included in a memory, nonvolatile memory (see below), disk storage (see below), and memory storage (see below). Further, nonvolatile memory can be included in read only memory, programmable read only memory, electrically programmable read only memory, electrically erasable programmable read only memory, or flash memory. Volatile memory can include random access memory, which acts as external cache memory. By way of illustration and not limitation, random access memory is available in many forms such as synchronous random access memory, dynamic random access memory, synchronous dynamic random access memory, double data rate synchronous dynamic random access memory, enhanced synchronous dynamic random access memory, Synchlink dynamic random access memory, and direct Rambus random access memory. Additionally, the disclosed memory components of systems or methods herein are intended to include, without being limited to including, these and any other suitable types of memory.

Examples can include subject matter such as a method, means for performing acts or blocks of the method, at least one machine-readable medium including instructions that, when performed by a machine cause the machine to perform acts of the method or of an apparatus or system for concurrent communication using multiple communication technologies according to embodiments and examples described herein.

Example 1 is a quadrature based voltage controlled oscillator (VCO) based local oscillator (LO) generator system. The system includes a phase detector, a quadrature phase VCO, a quadrature control path, an in-phase control path, and an in-phase VCO. The phase detector is configured to compare a reference clock and an in-phase VCO output and generate a phase error based on the comparison. The quadrature control path is configured to generate a quadrature control voltage based on a quadrature VCO output and the in-phase VCO output. The quadrature phase VCO is configured to generate the quadrature VCO output based on the quadrature control voltage and the generated phase error. The in-phase control path is configured to generate an in-phase control voltage based on the quadrature VCO output and the in-phase VCO output. The in-phase VCO is configured to generate the in-phase VCO output based on the in-phase control voltage and the generated phase error.

Example 2 includes the subject matter of Example 1, including or omitting optional elements, wherein the quadrature VCO includes a varactor based fine frequency control configured to modify the quadrature VCO output based on the generated phase error.

Example 3 includes the subject matter of any of Examples 1-2, including or omitting optional elements, wherein the quadrature VCO includes a varactor based fine frequency control configured to modify the quadrature VCO output based on the quadrature phase control voltage.

Example 4 includes the subject matter of any of Examples 1-3, including or omitting optional elements, wherein the quadrature VCO includes a varactor based fine frequency control configured to modify the quadrature VCO output based on the generated phase error.

Example 5 includes the subject matter of any of Examples 1-4, including or omitting optional elements, wherein the in-phase VCO includes a varactor based fine frequency control configured to modify the in-phase VCO output based on the in-phase control voltage and a second varactor based fine frequency control configured to modify the in-phase VCO output based on the generated phase error.

Example 6 includes the subject matter of any of Examples 1-5, including or omitting optional elements, wherein the quadrature control path includes a quadrature phase detector configured to generate the quadrature control voltage based on a comparison of the quadrature VCO output and the in-phase VCO output.

Example 7 includes the subject matter of any of Examples 1-6, including or omitting optional elements, wherein the in-phase control path includes an in-phase phase detector configured to generate the in-phase control voltage based on a comparison of the quadrature VCO output and the in-phase VCO output.

Example 8 includes the subject matter of any of Examples 1-7, including or omitting optional elements, further comprising transconductors configured to integrate detected phase errors to generate the quadrature control voltage and the in-phase control voltage.

Example 9 includes the subject matter of any of Examples 1-8, including or omitting optional elements, further comprising loop filters configured to generate the quadrature and in-phase control voltages.

Example 10 includes the subject matter of any of Examples 1-9, including or omitting optional elements, wherein the quadrature control path is configured to generate negative feedback due to image rejection of a quadrature phase detector.

Example 11 is a voltage controlled oscillator (VCO) system. The system comprises a first fine frequency control, a second fine frequency control, a phase detector and a control path. The first fine frequency control is configured to apply a first voltage to a VCO. The second fine frequency control is configured to apply a second voltage to the VCO. The VCO generates a local oscillator (LO) signal based on the first voltage and the second voltage. The phase detector is configured to generate the first voltage. The control path is configured to generate the second voltage based on the generated LO signal.

Example 12 includes the subject matter of Example 11, including or omitting optional elements, further comprising a loop filter configured to filter the first voltage and mitigate mismatches in VCO resonance frequencies.

Example 13 includes the subject matter of any of Examples 11-12, including or omitting optional elements, wherein the phase detector is configured to generate the first voltage based on a comparison of a low frequency reference signal and a second LO signal generated by a second VCO.

Example 14 includes the subject matter of any of Examples 11-13, including or omitting optional elements, wherein the phase detector is configured to generate the first voltage based on a comparison of a low frequency reference signal and the generated LO signal.

Example 15 is an all-digital dual mode phase locked/phase tracking (PL/PT) loop system. The system includes a digitally controlled oscillator (DCO), a time to digital converter (TDC), a digital phase detector (DPD), a digital loop filter (DLF), a switch, and a phase compensation processor (CP). The DCO is configured to generate a local oscillator (LO) signal. The TDC is configured to digitize a phase of the DCO in relation to a REF clock phase and generate a TDC output. The DPD is configured to compute or determine a phase error based on the TDC output. The DLF is configured to filter the phase error and generate a filtered phase error. The switch is configured to select one of a phase tracking (PT) mode and a phase locked (PL) mode and to select a path for the filtered phase-error. The phase CP is configured to compute a digital phase compensation signal based on the filtered phase error.

Example 16 includes the subject matter of Example 15, including or omitting optional elements, wherein the system and the switch is configured to operate in the PL mode, wherein the filtered phase error drives a digital control input of the DCO so that the phase of the DCO is following the REF clock phase.

Example 17 includes the subject matter of any of Examples 15-16, including or omitting optional elements, wherein the filtered phase error is used to update the frequency control word so that the frequency control word tracks the instantaneous frequency of the DCO.

Example 18 includes the subject matter of any of Examples 15-17, including or omitting optional elements, wherein the updated frequency control word is further used to create phase compensation information.

Example 19 includes the subject matter of any of Examples 15-18, including or omitting optional elements, wherein the system is configured to operate in a phase tracking (PT) mode to extract a digital representation of the DCO frequency by acquiring and tracking the phase of the DCO.

Example 20 includes the subject matter of any of Examples 15-19, including or omitting optional elements, further comprising a transmitter comprising a combiner circuit configured to update an information bearing base-band signal with the digital phase compensation; and an upconverter configured to upconvert the updated information bearing base-band signal to RF frequency signal using the LO signal.

Example 21 includes the subject matter of any of Examples 15-20, including or omitting optional elements, further comprising a transmitter comprising a combiner circuit configured to update an information bearing base-band signal with the digital phase compensation; and an upconverter configured to upconvert the updated information bearing base-band signal to RF frequency signal using the LO signal.

Example 22 a communication system comprising an all-digital dual mode phase locked/phase tracking (PL/PT)

loop, a transmitter and a receiver. The loop is configured to generate a local oscillator (LO) signal and a phase compensation, where the all-digital dual mode PL/PT loop includes a phase tracking (PT) mode and a phase locked (PL) mode. The transmitter is configured to generate a transmit radio frequency (RF) signal for transmission based on an information base band signal, the phase compensation and the generated LO signal. The receiver is configured to generate a received baseband signal based on a received RF signal, the phase compensation and the LO signal.

Example 23 includes the subject matter of Example 22, including or omitting optional elements, further comprising control circuitry configured to select one of the PT mode and the PL mode based on the transmitter and/or the receiver.

Example 24 includes the subject matter of any of Examples 17-18, including or omitting optional elements, wherein at least one of the transmitter and the receiver are configured to utilize the phase compensation upon the all-digital dual mode PL/PT loop operating in the PT mode.

It is to be understood that aspects described herein can be implemented by hardware, software, firmware, or any combination thereof. When implemented in software, functions can be stored on or transmitted over as one or more instructions or code on a computer-readable medium. Computer-readable media includes both computer storage media and communication media including any medium that facilitates transfer of a computer program from one place to another. A storage media or a computer readable storage device can be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or other tangible and/or non-transitory medium, that can be used to carry or store desired information or executable instructions. Also, any connection is properly termed a computer-readable medium. For example, if software is transmitted from a website, server, or other remote source using a coaxial cable, fiber optic cable, twisted pair, digital subscriber line (DSL), or wireless technologies such as infrared, radio, and microwave, then coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

Various illustrative logics, logical blocks, modules, and circuits described in connection with aspects disclosed herein can be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform functions described herein. A general-purpose processor can be a microprocessor, but, in the alternative, processor can be any conventional processor, controller, microcontroller, or state machine. A processor can also be implemented as a combination of computing devices, for example, a combination of a DSP and a microprocessor, a plurality of microprocessors, one or more microprocessors in conjunction with a DSP core, or any other such configuration. Additionally, at least one processor can comprise one or more modules operable to perform one or more of the s and/or actions described herein.

For a software implementation, techniques described herein can be implemented with modules (e.g., procedures, functions, and so on) that perform functions described herein. Software codes can be stored in memory units and executed by processors. Memory unit can be implemented within processor or external to processor, in which case memory unit can be communicatively coupled to processor through various means as is known in the art. Further, at least one processor can include one or more modules operable to perform functions described herein.

Techniques described herein can be used for various wireless communication systems such as CDMA, TDMA, FDMA, OFDMA, SC-FDMA and other systems. The terms "system" and "network" are often used interchangeably. A CDMA system can implement a radio technology such as Universal Terrestrial Radio Access (UTRA), CDMA1800, etc. UTRA includes Wideband-CDMA (W-CDMA) and other variants of CDMA. Further, CDMA1800 covers IS-1800, IS-95 and IS-856 standards. A TDMA system can implement a radio technology such as Global System for Mobile Communications (GSM). An OFDMA system can implement a radio technology such as Evolved UTRA (E-UTRA), Ultra Mobile Broadband (UMB), IEEE 802.11 (Wi-Fi), IEEE 802.16 (WiMAX), IEEE 802.18, Flash-OFDM, etc. UTRA and E-UTRA are part of Universal Mobile Telecommunication System (UMTS). 3GPP Long Term Evolution (LTE) is a release of UMTS that uses E-UTRA, which employs OFDMA on downlink and SC-FDMA on uplink. UTRA, E-UTRA, UMTS, LTE and GSM are described in documents from an organization named "3rd Generation Partnership Project" (3GPP). Additionally, CDMA1800 and UMB are described in documents from an organization named "3rd Generation Partnership Project 2" (3GPP2). Further, such wireless communication systems can additionally include peer-to-peer (e.g., mobile-to-mobile) ad hoc network systems often using unpaired unlicensed spectrums, 802.xx wireless LAN, BLUETOOTH and any other short- or long-range, wireless communication techniques.

Single carrier frequency division multiple access (SC-FDMA), which utilizes single carrier modulation and frequency domain equalization is a technique that can be utilized with the disclosed aspects. SC-FDMA has similar performance and essentially a similar overall complexity as those of OFDMA system. SC-FDMA signal has lower peak-to-average power ratio (PAPR) because of its inherent single carrier structure. SC-FDMA can be utilized in uplink communications where lower PAPR can benefit a mobile terminal in terms of transmit power efficiency.

Moreover, various aspects or features described herein can be implemented as a method, apparatus, or article of manufacture using standard programming and/or engineering techniques. The term "article of manufacture" as used herein is intended to encompass a computer program accessible from any computer-readable device, carrier, or media. For example, computer-readable media can include but are not limited to magnetic storage devices (e.g., hard disk, floppy disk, magnetic strips, etc.), optical disks (e.g., compact disk (CD), digital versatile disk (DVD), etc.), smart cards, and flash memory devices (e.g., EPROM, card, stick, key drive, etc.). Additionally, various storage media described herein can represent one or more devices and/or other machine-readable media for storing information. The term "machine-readable medium" can include, without being limited to, wireless channels and various other media capable of storing, containing, and/or carrying instruction(s)

and/or data. Additionally, a computer program product can include a computer readable medium having one or more instructions or codes operable to cause a computer to perform functions described herein.

Communications media embody computer-readable instructions, data structures, program modules or other structured or unstructured data in a data signal such as a modulated data signal, e.g., a carrier wave or other transport mechanism, and includes any information delivery or transport media. The term "modulated data signal" or signals refers to a signal that has one or more of its characteristics set or changed in such a manner as to encode information in one or more signals. By way of example, and not limitation, communication media include wired media, such as a wired network or direct-wired connection, and wireless media such as acoustic, RF, infrared and other wireless media.

Further, the actions of a method or algorithm described in connection with aspects disclosed herein can be embodied directly in hardware, in a software module executed by a processor, or a combination thereof. A software module can reside in RAM memory, flash memory, ROM memory, EPROM memory, EEPROM memory, registers, a hard disk, a removable disk, a CD-ROM, or any other form of storage medium known in the art. An exemplary storage medium can be coupled to processor, such that processor can read information from, and write information to, storage medium. In the alternative, storage medium can be integral to processor. Further, in some aspects, processor and storage medium can reside in an ASIC. Additionally, ASIC can reside in a user terminal. In the alternative, processor and storage medium can reside as discrete components in a user terminal. Additionally, in some aspects, the s and/or actions of a method or algorithm can reside as one or any combination or set of codes and/or instructions on a machine-readable medium and/or computer readable medium, which can be incorporated into a computer program product.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

In particular regard to the various functions performed by the above described components (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure. In addition, while a particular feature may have been disclosed with respect to only one of several implementations, such feature may be combined with one or more other features of the other implementations as may be desired and advantageous for any given or particular application.

What is claimed is:

1. A quadrature based voltage controlled oscillator (VCO) based local oscillator (LO) generator system comprising:
   a phase detector configured to compare a reference clock and an in-phase VCO output and generate a phase error based on the comparison;
   a quadrature control path configured to generate a quadrature control voltage based on a quadrature VCO output and the in-phase VCO output;
   a quadrature phase VCO configured to generate the quadrature VCO output based on the quadrature control voltage and the generated phase error;
   an in-phase control path configured to generate an in-phase control voltage based on the quadrature VCO output and the in-phase VCO output; and
   an in-phase VCO configured to generate the in-phase VCO output based on the in-phase control voltage and the generated phase error.

2. The system of claim 1, wherein the quadrature VCO includes a varactor based fine frequency control configured to modify the quadrature VCO output based on the generated phase error.

3. The system of claim 1, wherein the quadrature VCO includes a varactor based fine frequency control configured to modify the quadrature VCO output based on the quadrature control voltage.

4. The system of claim 1, wherein the in-phase VCO includes a varactor based fine frequency control configured to modify the in-phase VCO output based on the generated phase error.

5. The system of claim 1, wherein the in-phase VCO includes a varactor based fine frequency control configured to modify the in-phase VCO output based on the in-phase control voltage and a second varactor based fine frequency control configured to modify the in-phase VCO output based on the generated phase error.

6. The system of claim 1, wherein the quadrature control path includes a quadrature phase detector configured to generate the quadrature control voltage based on a comparison of the quadrature VCO output and the in-phase VCO output.

7. The system of claim 1, wherein the in-phase control path includes an in-phase phase detector configured to generate the in-phase control voltage based on a comparison of the quadrature VCO output and the in-phase VCO output.

8. The system of claim 1, further comprising transconductors configured to integrate detected phase errors to generate the quadrature control voltage and the in-phase control voltage.

9. The system of claim 8, wherein the phase errors comprise a quadrature phase error based on the output of the quadrature VCO output passed through a pass gate driven by the in-phase VCO output.

10. The system of claim 8, wherein the phase errors comprise an in-phase phase error based on the output of the in-phase VCO output passed through a pass gate driven by the quadrature VCO output.

11. The system of claim 1, further comprising loop filters configured to generate the quadrature and in-phase control voltages.

12. The system of claim 1, wherein the quadrature control path is configured to generate negative feedback due to image rejection of a quadrature phase detector.

13. The system of claim 1, wherein the in-phase VCO includes a varactor based fine frequency control configured to modify the in-phase VCO output based on the in-phase phase control voltage.

14. The system of claim 1, further comprising:
- transconductors configured to integrate detected phase errors to generate the quadrature control voltage and the in-phase control voltage; and
- loop filters configured to configured to provide a filtering of the generated quadrature control voltage and the in-phase control voltage.

* * * * *